(12) United States Patent
Shim et al.

(10) Patent No.: US 10,325,657 B2
(45) Date of Patent: Jun. 18, 2019

(54) NON-VOLATILE MEMORY DEVICES AND METHODS OF PROGRAMMING THE SAME

(71) Applicant: Samsung Electronics Co., Ltd., Suwon-si, Gyeonggi-do (KR)

(72) Inventors: Dong-kyo Shim, Seoul (KR); Sang-won Park, Seoul (KR); Su-chang Jeon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 26 days.

(21) Appl. No.: 15/793,221

(22) Filed: Oct. 25, 2017

(65) Prior Publication Data

US 2018/0211705 A1    Jul. 26, 2018

(30) Foreign Application Priority Data

Jan. 25, 2017 (KR) .................. 10-2017-0012048
Apr. 20, 2017 (KR) .................. 10-2017-0051073

(51) Int. Cl.
| | | |
|---|---|---|
| G11C 16/10 | (2006.01) | |
| G11C 16/04 | (2006.01) | |
| G11C 16/34 | (2006.01) | |
| G11C 16/08 | (2006.01) | |
| G11C 11/4094 | (2006.01) | |
| G11C 16/26 | (2006.01) | |
| G11C 16/30 | (2006.01) | |
| G11C 11/56 | (2006.01) | |
| G11C 16/24 | (2006.01) | |

(52) U.S. Cl.
CPC ...... *G11C 16/0483* (2013.01); *G11C 11/4094* (2013.01); *G11C 11/5628* (2013.01); *G11C 16/08* (2013.01); *G11C 16/10* (2013.01); *G11C 16/24* (2013.01); *G11C 16/26* (2013.01); *G11C 16/30* (2013.01); *G11C 16/3427* (2013.01)

(58) Field of Classification Search
CPC ..... G11C 16/0483; G11C 16/10; G11C 16/08; G11C 16/26; G11C 16/3459; G11C 16/12; G11C 16/14; G11C 16/16; G11C 11/1673; G11C 13/0061
See application file for complete search history.

(56) References Cited

U.S. PATENT DOCUMENTS

| | | |
|---|---|---|
| 7,843,733 B2 | 11/2010 | Kim et al. |
| 8,488,381 B2 | 7/2013 | Kim et al. |
| 8,514,625 B2 | 8/2013 | Shim et al. |
| 9,269,441 B2 * | 2/2016 | Aritome ............... G11C 16/10 |
| 9,373,409 B2 | 6/2016 | Chang et al. |
| 9,406,393 B2 * | 8/2016 | Park ................ G11C 16/3459 |
| 9,679,657 B2 * | 6/2017 | Park .................... G11C 16/12 |

(Continued)

*Primary Examiner* — Hien N Nguyen
(74) *Attorney, Agent, or Firm* — Myers Bigel, P.A.

(57) ABSTRACT

Methods of programming a non-volatile memory device including N string selection lines, a word line, first and second bit line groups are provided. The method may include sequentially programming first memory cells that are connected to the word line and at least one bit line included in the first bit line group by sequentially selecting the N string selection lines in response to sequentially applied first to N-th addresses, and then sequentially programming second memory cells that are connected to the word line and at least one bit line included in the second bit line group by sequentially selecting one of the N string selection lines in response to sequentially applied N+1-th to 2N-th addresses.

14 Claims, 33 Drawing Sheets

(56) References Cited

U.S. PATENT DOCUMENTS

| | | | |
|---|---|---|---|
| 10,020,057 B2* | 7/2018 | Park | G11C 16/10 |
| 2012/0047321 A1 | 2/2012 | Yoon et al. | |
| 2012/0287720 A1* | 11/2012 | Choi | G11C 16/10 |
| | | | 365/185.19 |
| 2015/0179269 A1 | 6/2015 | Lee | |
| 2015/0301941 A1 | 10/2015 | Jun et al. | |
| 2016/0093384 A1 | 3/2016 | Lee | |
| 2016/0276035 A1 | 9/2016 | So et al. | |
| 2017/0092361 A1* | 3/2017 | Kang | G11C 16/0466 |
| 2017/0169883 A1* | 6/2017 | Kwon | G11C 7/14 |
| 2017/0287561 A1* | 10/2017 | Lee | G11C 16/10 |
| 2018/0374541 A1* | 12/2018 | Jung | G11C 16/20 |

* cited by examiner

ADDR= CHIP_ADDR + LPN

ADDR'= BLK_ADDR + WL_ADDR + BLG_ADDR + SSL_ADDR

FIG. 3B

| SSL_ADDR | SSL |
|---|---|
| 0 0 | SSL1 |
| 0 1 | SSL2 |
| 1 0 | SSL3 |
| 1 1 | SSL4 |

FIG. 3C

| BLG_ADDR | BLG |
|---|---|
| 0 0 | BLG1 |
| 0 1 | BLG2 |
| 1 0 | BLG3 |
| 1 1 | BLG4 |

FIG. 15B

| Order | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| SSL | 1 | 2 | 3 | 4 | 1 | 2 | 3 | 4 | 1 | 2 | 3 | 4 | 1 | 2 | 3 | 4 |
| BL | 1 | 1 | 1 | 1 | 2 | 2 | 2 | 2 | 3 | 3 | 3 | 3 | 4 | 4 | 4 | 4 |

NON-VOLATILE MEMORY DEVICES AND METHODS OF PROGRAMMING THE SAME

CROSS-REFERENCE TO RELATED APPLICATIONS

This application claims priority under 35 U.S.C. § 119 to Korean Patent Application Nos. 10-2017-0012048, filed on Jan. 25, 2017, and 10-2017-0051073, filed on Apr. 20, 2017, in the Korean Intellectual Property Office, the disclosures of which are incorporated by reference herein in their entireties.

BACKGROUND

The inventive concept relates to a memory device, and more particularly, to a non-volatile memory device including a plurality of string selection lines and a plurality of bit line groups and a method of programming the non-volatile memory device.

Memory devices may be used to store data and may be classified into volatile memory devices and non-volatile memory devices. A flash memory device, which is an example of the non-volatile memory device, may be applied to portable phones, digital cameras, personal digital assistants (PDAs), transportable computer devices, fixed computer devices, and other devices.

SUMMARY

According to an aspect of the inventive concept, there is provided a method of programming a non-volatile memory device including N string selection lines, a word line, a first bit line group and a second bit line group. The method may include sequentially programming first memory cells that are connected to the word line and at least one bit line included in the first bit line group by sequentially selecting the N string selection lines in response to sequentially applied first to N-th addresses, and then sequentially programming second memory cells that are connected to the word line and at least one bit line included in the second bit line group by sequentially selecting one of the N string selection lines in response to sequentially applied N+1-th to 2N-th addresses. N may be a natural number greater than or equal to 2.

According to another aspect of the inventive concept, there is provided a method of programming a non-volatile memory device including a first string selection line and a second string selection line, a word line, a first bit line group and a second bit line group. The method may include programming first memory cells that are connected to the word line, the first string selection line, and first bit lines included in the first bit line group, in response to a first address and a first program command, then, programming second memory cells that are connected to the word line, the second string selection line, and the first bit lines included in the first bit line group, in response to a second address and a second program command, then, programming third memory cells that are connected to the word line, the first string selection line, and second bit lines included in a second bit line group, in response to a third address and a third program command, and then, programming fourth memory cells that are connected to the word line, the second string selection line, and the second bit lines included in the second bit line group, in response to a fourth address and a fourth program command.

According to another aspect of the inventive concept, there is provided a method of programming a non-volatile memory device including string selection lines, a word line, and bit line groups. The method may include receiving an address and a program command, converting the address into a corrected address such that a string selection line address of the string selection lines is at a lower bit than a bit line group address of the bit line groups, and programming memory cells that are connected to the word line, one of the string selection lines, and one of the bit line groups in response to the corrected address.

According to another aspect of the inventive concept, there is provided a method of programming a non-volatile memory device including a word line, a plurality of memory cells connected to the word line and a plurality of bit lines including a first bit line and a second bit line. The method may include programming first ones of the plurality of memory cells connected to the first bit line and then programming second ones of the plurality of memory cells connected to the second bit line.

BRIEF DESCRIPTION OF THE DRAWINGS

Embodiments of the inventive concept will be more clearly understood from the following detailed description taken in conjunction with the accompanying drawings in which:

FIG. 3B is an example of a selection line address included in a corrected address according to some embodiments of the inventive concept;

FIG. 3C is an example of a bit line group address included in a corrected address according to some embodiments of the inventive concept;

FIGS. 15A and 15B illustrate a sequential program order of a non-volatile memory device according to some embodiments of the inventive concept;

DETAILED DESCRIPTION OF THE EMBODIMENTS

Figure 1:
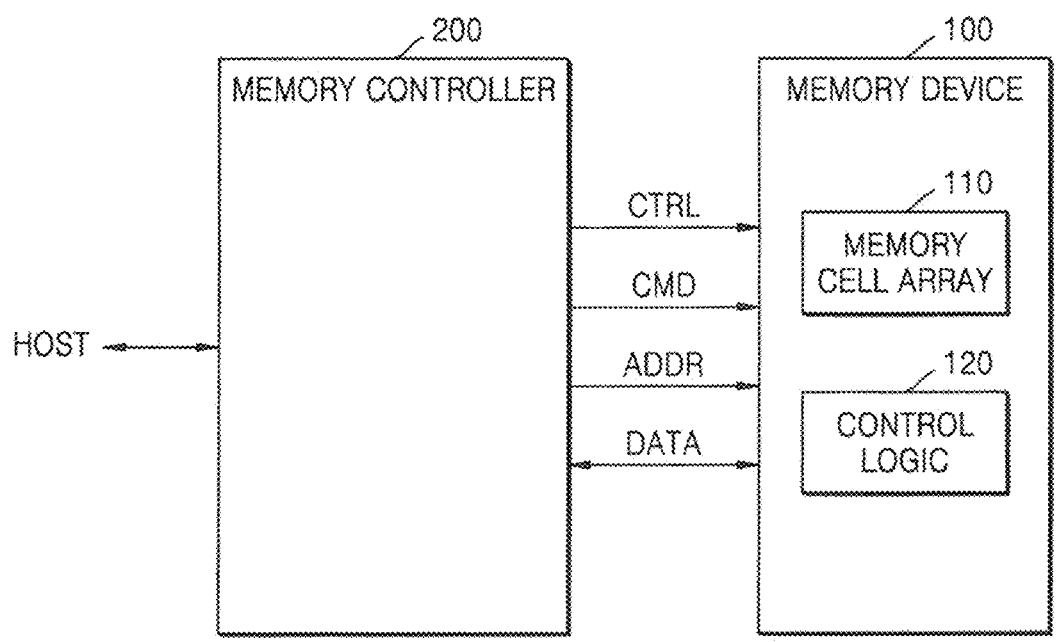
FIG. 1 is a block diagram of a memory system according to some embodiments of the inventive concept.

FIG. 1 is a block diagram of a memory system 10 according to some embodiments of the inventive concept.

Referring to FIG. 1, the memory system 10 may include a memory device 100 and a memory controller 200. The memory device 100 may include a memory cell array 110 and a control logic 120. The memory device 100 may be a non-volatile memory device. In some embodiments, the memory system 10 may be an internal memory embedded in an electronic device. For example, the memory system 10 may be an embedded universal flash storage (UFS) memory device, an embedded multi-media card (eMMC), or a solid-state drive (SSD). In some embodiments, the memory system 10 may be an external memory capable of being attached to and detached from an electronic device. For example, the memory system 10 may be a UFS memory card, a compact flash (CF), a secure digital (SD), a micro-secure digital (micro-SD), a mini-secure digital (mini-SD), an extreme digital (xD), or a memory stick.

The memory controller 200 may control the memory device 100 to read data stored in the memory device 100 or write data to the memory device 100 in response to read/write requests from a host HOST. Specifically, the memory controller 200 may provide an address ADDR, a command CMD, and a control signal CTRL to the memory device 100 and may control program, read, and erase operations of the memory device 100. Also, the memory controller 200 may transmit and receive data DATA for a program operation and/or a read operation to and from the memory device 100.

The memory cell array 110 may include a plurality of memory cells. For example, the plurality of memory cells may be flash memory cells. Hereinafter, embodiments will be described assuming that the plurality of memory cells are NAND flash memory cells. However, the inventive concept is not limited thereto. In some embodiments, the plurality of memory cells may be resistive memory cells, such as resistive RAM (ReRAM) memory cells, phase-change RAM (PRAM) memory cells, or magnetic RAM (MRAM) memory cells.

The memory cell array 110 may include a plurality of NAND strings connected respectively to intersections at which a plurality of string selection lines intersect a plurality of bit lines, and each of the NAND strings may include a plurality of memory cells. Word lines located at the same level may be shared among the plurality of string selection lines. The plurality of bit lines may be divided into a plurality of bit line groups according to a sequential program order. In some embodiments of the inventive concept, the plurality of bit lines may be divided into first and second bit line groups. In this case, memory cells connected to a first bit line group may be sequentially programmed by units of string selection lines, and then, memory cells connected to a second bit line group may be sequentially programmed by units of string selection lines. The plurality of bit line groups will be described in further detail with reference to FIGS. 7 to 9.

The control logic 120 may receive a command CMD and an address ADDR from the memory controller 200 and convert the address ADDR into a corrected address so that a string selection line address may be located in a lower bit than a bit line group address. In this case, the command CMD may correspond to a program command. Also, the control logic 120 may sequentially program memory cells included in the first bit line group and then sequentially program memory cells included in the second bit line group based on the corrected address. An address conversion operation of the control logic 120 will be described in further detail with reference to FIGS. 3A to 3C.

Figure 2:
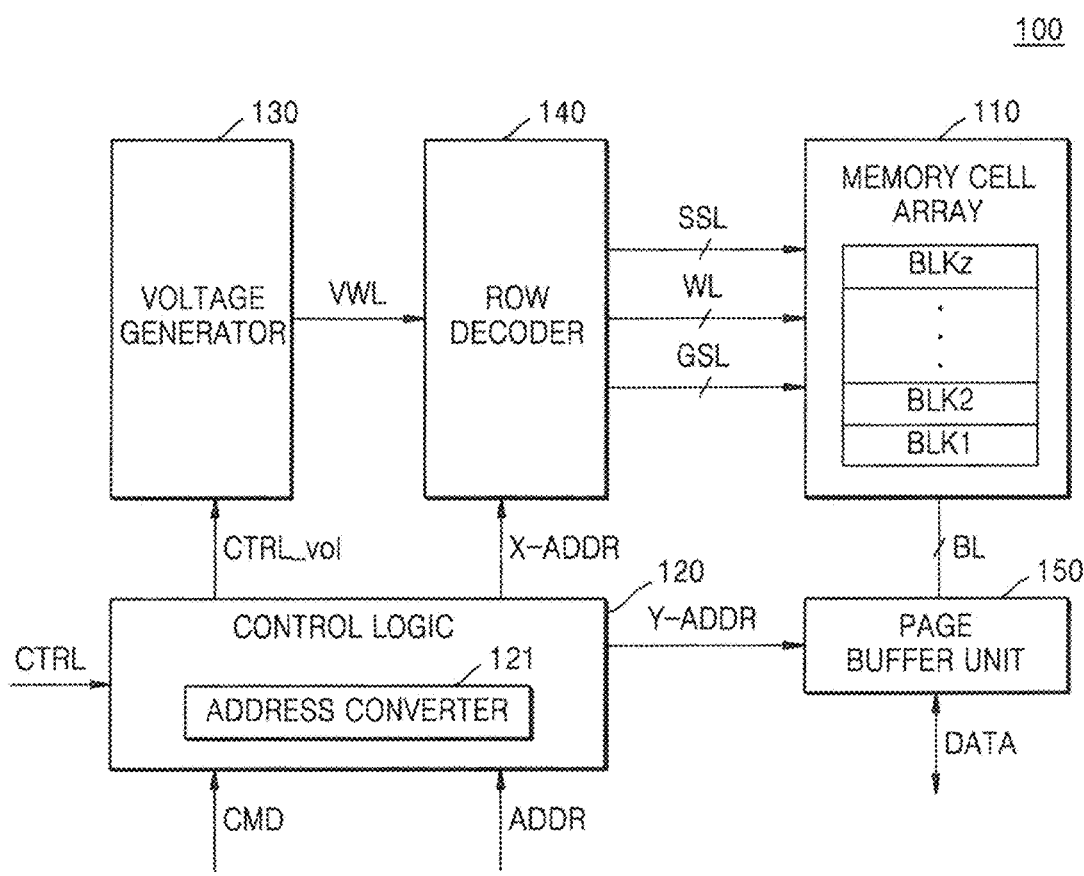
FIG. 2 is a detailed block diagram of the memory device of FIG. 1 according to some embodiments of the inventive concept.

FIG. 2 is a detailed block diagram of the memory device 100 of FIG. 1 according to some embodiments of the inventive concept. Referring to FIG. 2, the memory device 100 may include a memory cell array 110, a control logic 120, a voltage generator 130, a row decoder 140, and a page buffer unit 150. Although not shown, the memory device 100 may further include a data input/output (I/O) circuit or an I/O interface.

The memory cell array 110 may include a plurality of memory cells and may be connected to word lines WL, string selection lines SSL, ground selection lines GSL, and bit lines BL. Specifically, the memory cell array 110 may be connected to the row decoder 140 through the word lines WL, the string selection lines SSL, and the ground selection lines GSL and may be connected to the page buffer unit 150 through the bit lines BL. In the present embodiment, the bit lines BL may be divided into a plurality of bit line groups according to a sequential program order.

Each of the memory cells may store at least one bit. Specifically, each of the memory cells may be a single-level cell (SLC), a multi-level cell (MLC), or a triple-level cell (TLC). In some embodiments of the inventive concept, some of a plurality of memory blocks BLK1 to BLKz included in the memory cell array 110 may be SLC blocks, and others of the memory blocks BLK1 to BLKz included in the memory cell array 110 may be MLC blocks or TLC blocks.

In some embodiments of the inventive concept, the memory cell array 110 may include a two-dimensional (2D) memory cell array, which may include a plurality of NAND strings arranged in rows and columns. A 2D configuration of the memory cell array 110 will be described below with reference to FIG. 6. In some embodiments of the inventive concept, the memory cell array 110 may include a three-dimensional (3D) memory cell array, which may include a plurality of NAND strings. Each of the NAND strings may include memory cells, which are respectively connected to word lines vertically stacked on a substrate. A 3D configuration of the memory cell array 110 will be described below with reference to FIGS. 4 and 5.

The 3D memory cell array may be monolithically formed in one or more physical levels of memory cell arrays having an active area provided above a substrate (e.g., a silicon substrate) and circuitry associated with the operation of memory cells. The associated circuitry may be above or within the substrate. The term "monolithic" means that layers of each level of the 3D memory cell array are directly deposited on the layers of each underlying level of the 3D memory cell array.

In some embodiments of the inventive concept, the 3D memory cell array may include NAND strings in which at least one memory cell is located on another memory cell in a vertical direction. The at least one memory cell may include a charge trap layer. The following patent documents, which are hereby incorporated by reference, disclose suitable configurations for 3D memory arrays, in which the 3D memory array is configured at a plurality of levels, with word lines and/or bit lines shared between levels; U.S. Pat. Nos. 7,679,133; 8,553,466; 8,654,587; 8,559,235; and U.S. Patent Publication No. 2011/0233648.

The control logic 120 may write data to the memory cell array 110 or output various control signals for reading data from the memory cell array 110 based on the command CMD, the address ADDR, and the control signal CTRL, which are received from the memory controller 200. Thus, the control logic 120 may generally control various internal operations of the memory device 100. Specifically, the control logic 120 may provide a voltage control signal CTRL_vol to the voltage generator 130, provide a row address X-ADDR to the row decoder 140, and provide a column address Y-ADDR to the page buffer unit 150. However, the inventive concept is not limited thereto, and the control logic 120 may further provide control signals to the voltage generator 130, the row decoder 140, and the page buffer unit 150. In the present embodiment, the control logic 120 may include an address converter 121. Hereinafter, operations of the address converter 121 will be described in detail with reference to FIGS. 3A to 3C.

Figure 3A:
FIG. 3A is a diagram of an address conversion operation according to some embodiments of the inventive concept.

FIG. 3A illustrates an address conversion operation according to some embodiments of the inventive concept.

Referring to FIGS. 2 and 3A; the address converter 121 may convert an address ADDR received from the memory controller 200 into a corrected address ADDR'. For example, the address ADDR may include a chip address CHI-P_ADDR for selecting one of a plurality of memory chips and a logical address, for example, a logical page number (LPN).

The corrected address ADDR' may include a block address BLK_ADDR for selecting one of a plurality of memory blocks, a word line address WL_ADDR for selecting one of a plurality of word lines, a bit line group address BLG_ADDR for selecting one of a plurality of bit line groups, and a string selection line address SSL_ADDR for selecting one of a plurality of string selection lines. In some embodiments of the inventive concept, in the corrected address ADDR', the block address BLK_ADDR may be at a most significant bit (MSB), the word line address WL_ADDR may be at a lower bit than the block address BLK_ADDR, the bit line group address BLG_ADDR may be at a lower bit than the word line address WL_ADDR, and the string selection line address SSL_ADDR may be at a least significant bit (LSB).

Figure 3B:
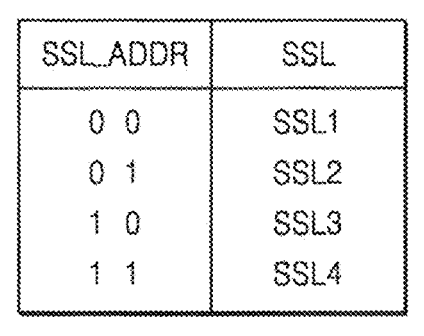

FIG. 3B is an example of a string selection line address SSL_ADDR included in a corrected address ADDR' according to some embodiments of the inventive concept.

Figure 10:
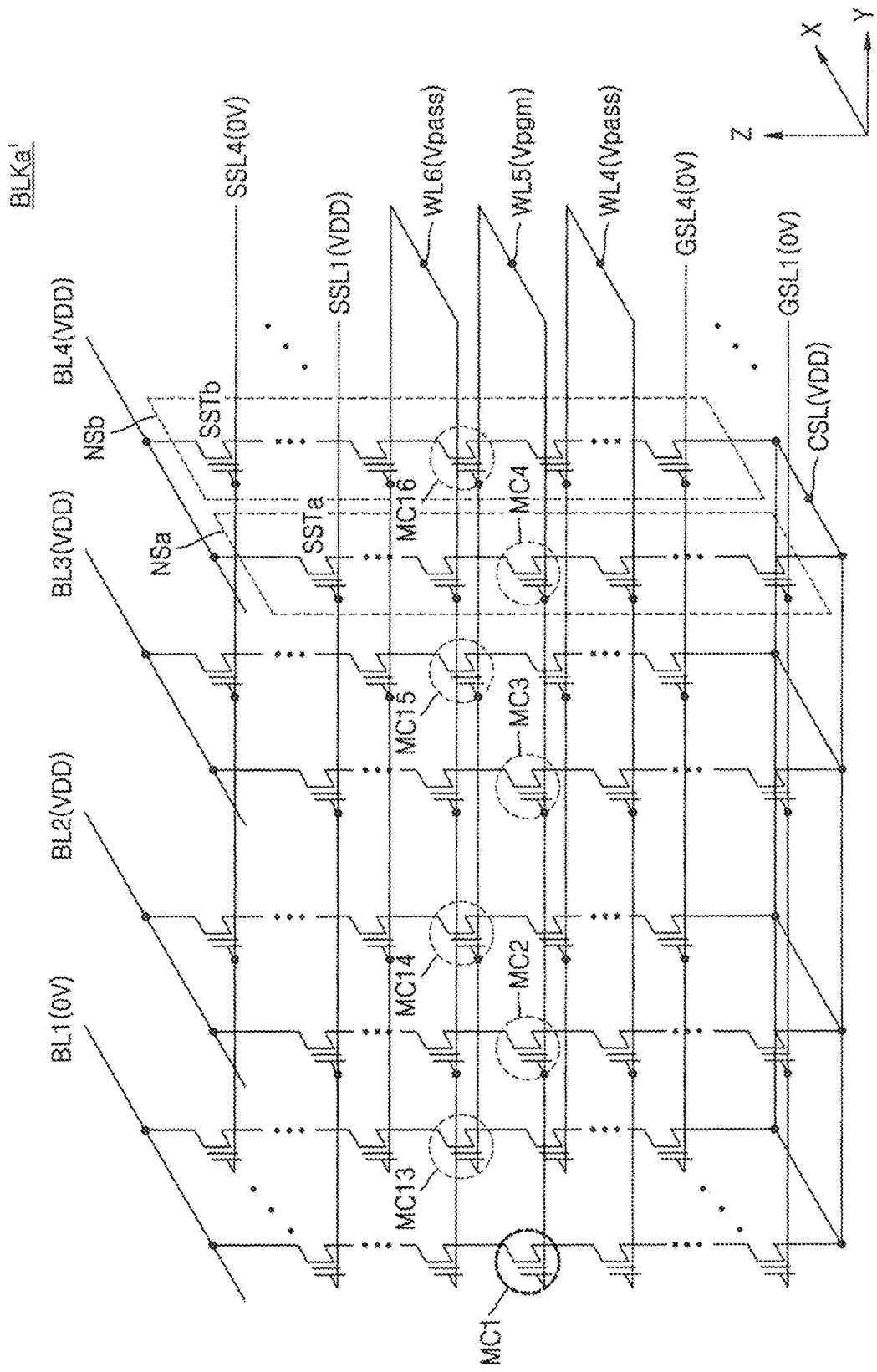
FIG. 10 is a circuit diagram showing program bias conditions according to some embodiments of the inventive concept.
Figure 11:
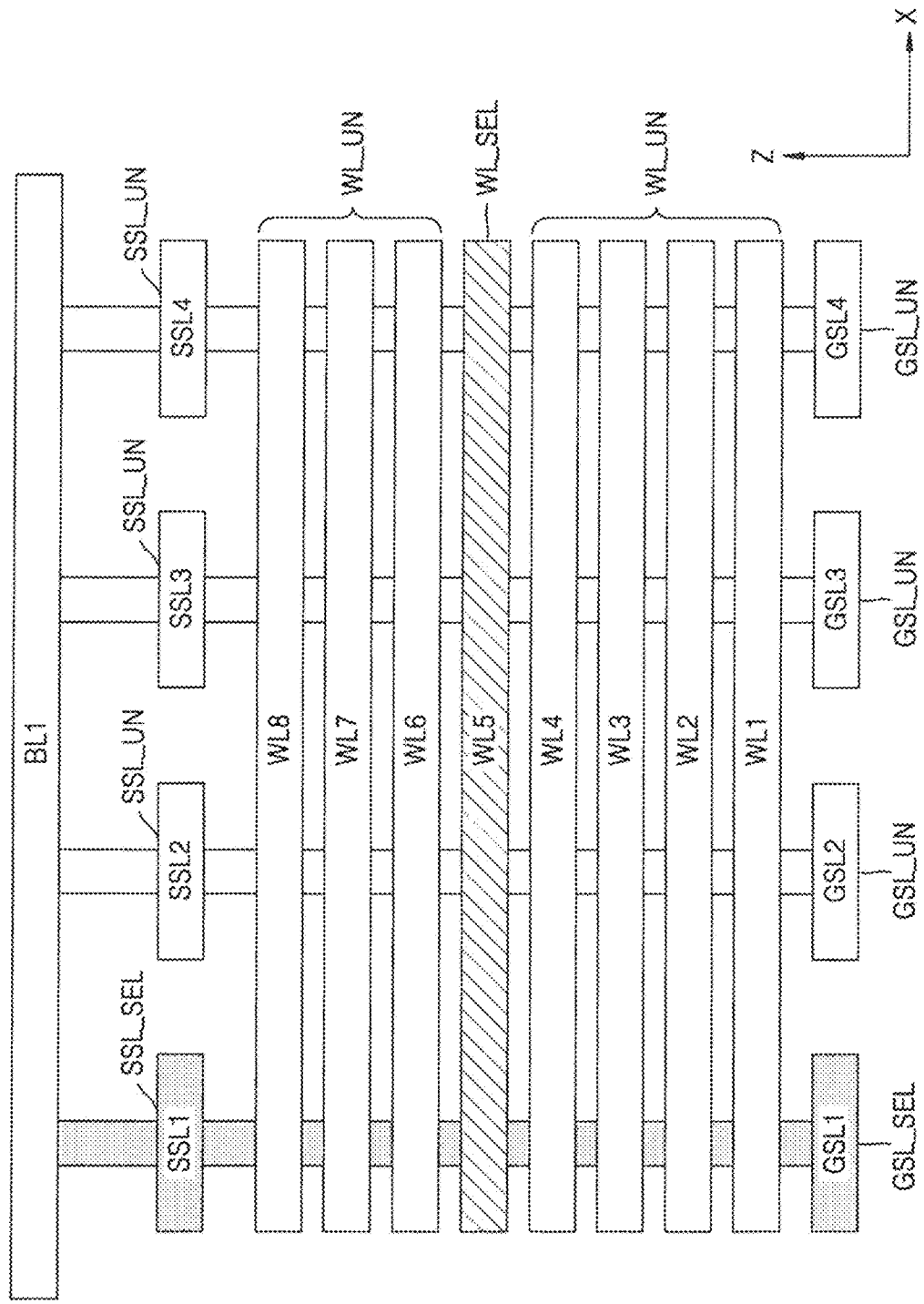
FIG. 11 is a diagram of a memory device corresponding to the circuit diagram of FIG. 10 according to some embodiments of the inventive concept.

The string selection line address SSL_ADDR may be generated with N bits corresponding to the number of a plurality of string selection lines configured to share a word line. Here, N may be an integer greater than or equal to 1. For example, as shown in FIGS. 10 and 11, when a word line is shared among four string selection lines, the string selection line address SSL_ADDR may be generated with 2 bits. For example, when the string selection line address SSL_ADDR is 00, the first string selection line SSL1 may be selected.

Figure 3C:
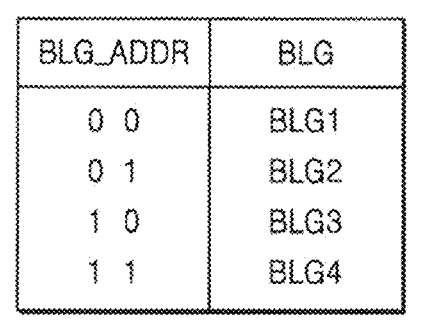

FIG. 3C is an example of the bit line group address BLG_ADDR included in the corrected address ADDR' according to some embodiments of the inventive concept.

Figure 7:
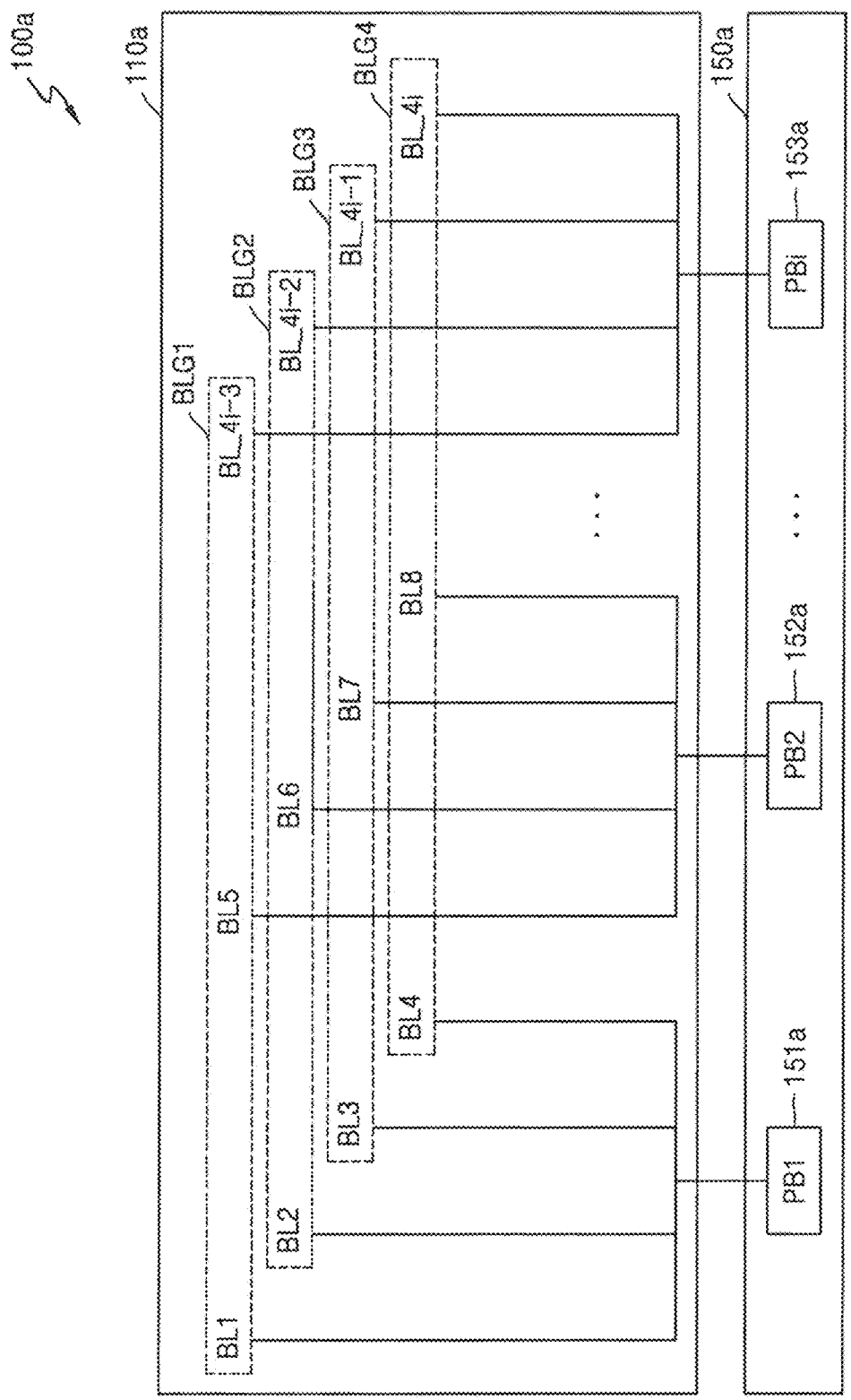
FIG. 7 is a diagram of a memory device including a page buffer unit having a quadruple bit line (QBL) structure according to some embodiments of the inventive concept.

The bit line group address BLG_ADDR may be generated with M bits corresponding to the number of a plurality of bit line groups. Here, M is an integer greater than or equal to 1. For example, as shown in FIG. 7, when a plurality of bit lines are divided into four bit line groups, the bit line group address BLG_ADDR may be generated with 2 bits. For example, when the bit line group address BLG_ADDR is 00, the first bit line group BLG1 may be selected.

Referring back to FIG. 2, the voltage generator 130 may generate various kinds of voltages for performing a program operation, a read operation, and an erase operation on the memory cell array 110, based on a voltage control signal CTRL_vol. Specifically, the voltage generator 130 may generate a word line voltage VWL, for example, a program voltage, a read voltage, a pass voltage, an erase verification voltage, or a program verification voltage. Also, the voltage generator 130 may further generate a string selection line voltage and a ground selection line voltage based on the voltage control signal CTRL_vol. Also, the voltage generator 130 may further generate an erase voltage to be provided to the memory cell array 110.

In response to the row address X-ADDR received from the control logic 120, the row decoder 140 may select one of memory blocks BLK1 to BLKz, may select one of word lines WL of a selected memory block and may select one of a plurality of string selection lines SSL. Here, the row address X-ADDR may include the block address BLK_ADDR, the word line address WL_ADDR, and the string selection line address SSL_ADDR, which are included in the corrected address ADDR' as shown in FIG. 3A.

The page buffer unit 150 may be connected to the memory cell array 110 through bit lines BL and may select some of the bit lines BL in response to a column address Y-ADDR received from the control logic 120. Here, the column address Y-ADDR may include the bit line group address BLG_ADDR included in the corrected address ADDR' as shown in FIG. 3A. Specifically, the page buffer unit 150 may operate as a write driver or a sense amplifier depending on an operation mode. During a program operation, the page buffer unit 150 may transmit a bit line voltage corresponding to data to be programmed to a selected bit line of the memory cell array 110. During a read operation, the page buffer unit 150 may sense data stored in a selected memory cell through the bit line.

Figure 4:
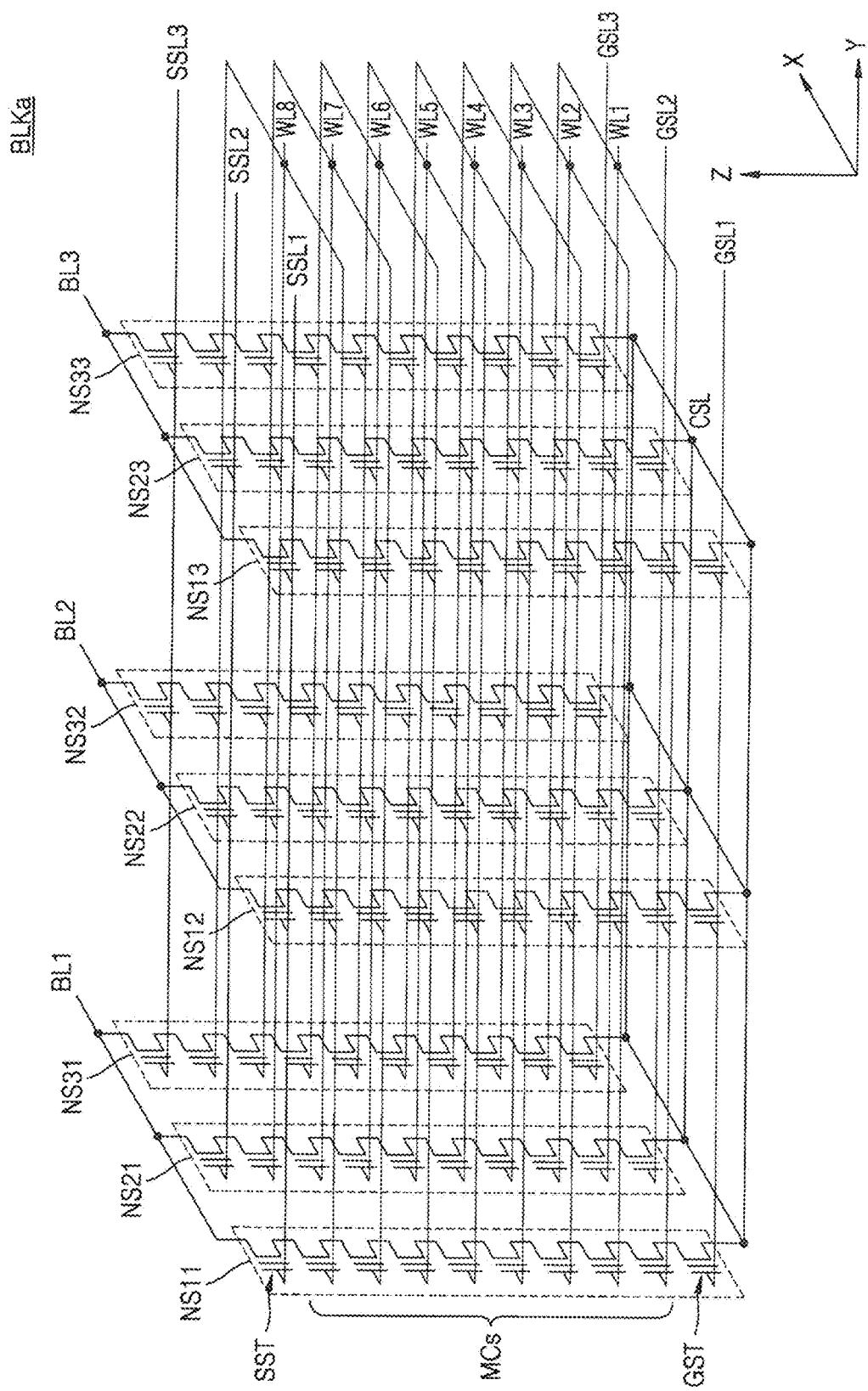
FIG. 4 is a circuit diagram of an example of the memory block of FIG. 2 according to some embodiments of the inventive concept.

FIG. 4 is a circuit diagram of a memory block BLKa, which is an example of the memory blocks BLK1 to BLKz shown in FIG. 2, according to some embodiments of the inventive concept.

Referring to FIG. 4, the memory block BLKa may include a plurality of strings (e.g., NS11 to NS33), a plurality of word lines (e.g., WL1 to WL8), a plurality of bit lines (e.g., BL1 to BL3), a plurality of ground selection lines (e.g., GSL1 to GSL3), a plurality of string selection lines (e.g., SSL1 to SSL3), and a common source line CSL. The number of NAND strings, the number of word lines, the number of bit lines, the number of ground selection lines, and the number of string selection lines may be variously changed according to embodiments. In some embodiments, the plurality of bit lines extend longitudinally in a second direction (e.g., an X direction), and the plurality of string selection lines extend longitudinally in a first direction (e.g., a Y direction), as illustrated in FIG. 4.

The NAND strings NS11, NS21, and NS31 may be provided between the first bit line BL1 and the common source line CSL, and the NAND strings NS12, NS22, and NS32 may be provided between the second bit line BL2 and the common source line CSL. Also, the NAND strings NS13, NS23, and NS33 may be provided between the third bit line BL3 and the common source line CSL. Each of the NAND strings, for example, the NAND string NS11, may include a string selection transistor SST, a plurality of memory cells MC, and a ground selection transistor GST, which may be connected in series. Hereinafter, the NAND string will be referred to as a string for brevity.

String selection transistors SST may be connected to the string selection lines SSL1 to SSL3 corresponding thereto. The plurality of memory cells MC may be respectively connected to the word line WL1 to WL8 corresponding thereto. Ground selection transistors GST may be connected to the ground selection lines GSL1 to GSL3 corresponding thereto. The string selection transistors SST may be connected to the bit lines BL1 to BL3 corresponding thereto, and the ground selection transistors GST may be connected to the common source line CSL.

In the present embodiment, word lines (e.g., WL1) located at the same level in a third direction (e.g., Z direction) may be connected in common to one another, the string selection lines SSL1 to SSL3 may be separated from one another, and the ground selection lines GSL1 to GSL3 may also be separated from one another as illustrated in FIG. 4. Although FIG. 4 illustrates that word lines located at the same level in the third direction are shared among the three string selection lines SSL1 to SSL3, the inventive concept is not limited thereto. For example, word lines located at the same level in the third direction may be shared between two string selection lines. In some embodiments, word lines located at the same level in the third direction may be shared among four string selection lines.

Although FIG. 4 illustrates that each string includes one string selection transistor SST, the inventive concept is not limited thereto. Each string may include an upper string selection transistor and a lower string selection transistor, which are connected in series. Also, although FIG. 4 illustrates that each string includes one ground selection transistor GST, the inventive concept is not limited thereto. Each string may include an upper ground selection transistor and a lower ground selection transistor, which are connected in series. In this case, upper ground selection transistors may be connected to the ground selection lines GSL1 to GSL3 corresponding thereto, while lower ground selection transistors may be connected in common to a common ground selection line.

Figure 5:
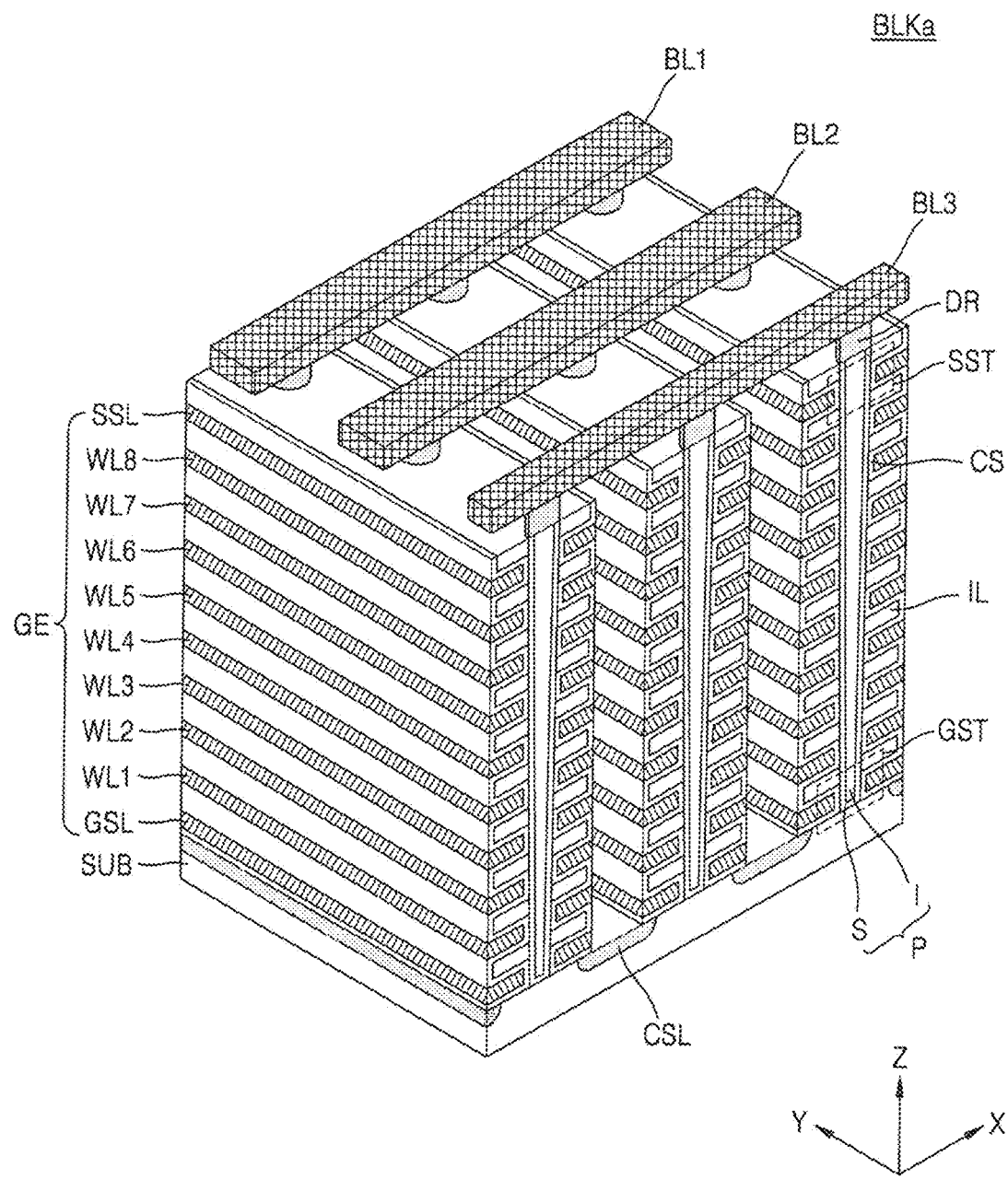
FIG. 5 is a perspective view of an example of the memory block of FIG. 2 according to some embodiments of the inventive concept.

FIG. 5 is a perspective view of the memory block BLKa of FIG. 4, which is an example of the memory blocks BLK1 to BLKz of FIG. 2.

Referring to FIG. 5, the memory block BLKa may be provided on a substrate SUB, and the substrate SUB and the memory block BLKa may be arranged along the third direction (i.e., a vertical direction). Although FIG. 5 illustrates an example in which the memory block BLKa includes two selection lines GSL and SSL, eight word lines WL1 to WL8, and three bit lines BL1 to BL3, the memory block BLKa may actually include more or fewer selection lines, word lines, and bit lines than those described above.

The substrate SUB may have a first conductivity type (e.g., a p-type). A common source line CSL may be provided on the substrate SUB and may extend in a first direction (e.g., an Y direction). The common source line CSL may be doped with impurities of a second conductivity type (e.g., an n-type). A plurality of insulating layers IL may be provided on a region of the substrate SUB between two adjacent common source lines CSL and extend in the first direction. The plurality of insulating layers IL may be sequentially provided and spaced a apart from one another by predetermined distance in a third direction (e.g., a Z direction). For example, the plurality of insulating layers IL may include an insulating material, such as silicon oxide.

A plurality of pillars P may be provided on a region of the substrate SUB between two adjacent common source lines CSL and sequentially arranged in the first direction. The plurality of pillars P may penetrate the plurality of insulating layers IL in the third direction. For example, the plurality of pillars P may penetrate the plurality of insulating layers IL and contact the substrate SUB. Specifically, a surface layer S of each of the pillars P may include a p-type silicon material and function as a channel region. Meanwhile, an inner layer I of each of the pillars P may include an insulating material (e.g., silicon oxide) or an air gap.

A charge storage layer CS may be provided along exposed surfaces of the insulating films IL, the pillars P, and the substrate SUB between two adjacent common source lines CSL. The charge storage layer CS may include a gate insulating layer (or referred to as a tunneling insulating layer), a charge trap layer, and a blocking insulating layer. For example, the charge storage layer CS may have an oxide-nitride-oxide (ONO) structure. Also, gate electrodes GE, such as the selection lines GSL and SSL and the word lines WL1 to WL8, may be provided on an exposed surface of the charge storage layer CS in a region between two adjacent common source lines CSL.

Drains or drain contacts DR may be provided on the plurality of pillars P, respectively. For example, the drains or drain contacts DR may include a silicon material doped with impurities having a second conductivity type. Bit lines BL1 to BL3 may be provided on the drains DR. The bit lines BL1 to BL3 may extend in a second direction (e.g., an X direction) and be spaced apart from one another by a predetermined distance in the first direction.

Figure 6:
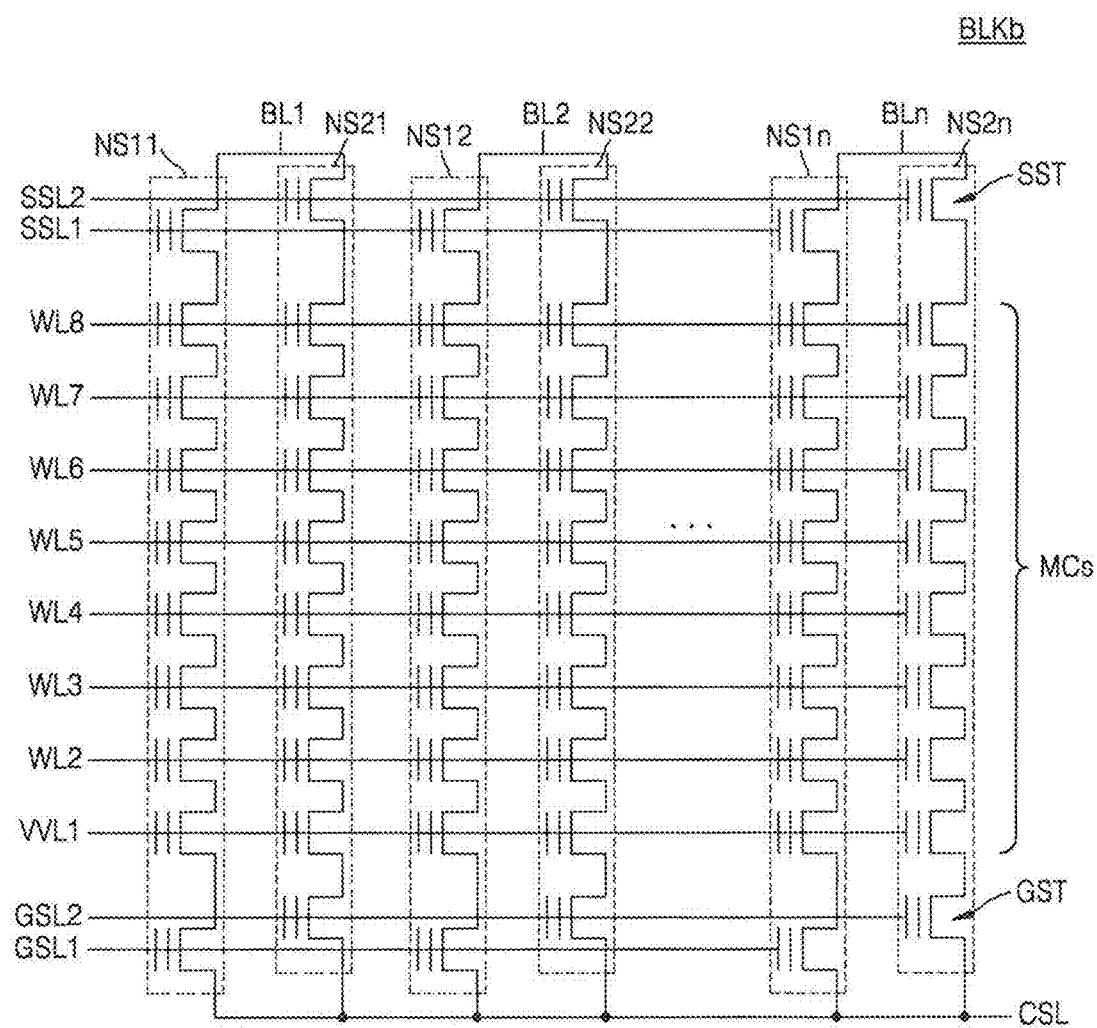
FIG. 6 is a circuit diagram of an example of the memory block of FIG. 2 according to some embodiments of the inventive concept.

FIG. 6 is a circuit diagram of a memory block BLKb, which is an example of the memory blocks BLK1 to BLKz of FIG. 2, according to some embodiments of the inventive concept.

Referring to FIG. 6, the memory block BLKb may be a NAND flash memory having a planar structure, and at least one of the memory blocks BLK1 to BLKz shown in FIG. 2 may be embodied as shown in FIG. 6. The memory block BLKb may include a plurality of strings (e.g., NS11 to NS2n), a plurality of word lines (e.g., WL1 to WL8), a plurality of bit lines (e.g., BL1 to BLn), a plurality of ground selection lines (e.g., GSL1 and GSL2), a plurality of string selection lines (e.g., SSL1 and SSL2), and a common source line CSL. The number of strings, the number of word lines, the number of bit lines, the number of ground selection lines, and the number of string selection lines may be variously changed according to embodiments.

The word lines WL1 to WL8 may be shared among the plurality of strings NS11 to NS2n as illustrated in FIG. 6, and one bit line may be shared among at least two strings. For example, a first bit line BL1 may be shared between first and second strings NS11 and NS21, a string selection transistor SST and a ground selection transistor GST of the first string NS11 may be connected to a first string selection line SSL1 and a first ground selection line GSL1, respectively, and a string selection transistor SST and a ground selection transistor GST of the second string NS21 may be connected to a second string selection line SSL2 and a second ground selection line GSL2, respectively.

Thus, when memory cells that are connected to the first word line WL1 and belong to the strings NS11 and NS12 to NS1n are programmed, the first word line WL1, the first string selection line SSL1, and the first ground selection line GSL1 may be selected. When memory cells that are connected to the first word line WL1 and belong to the strings NS21 and NS22 to NS2n are programmed, the first word line WL1, the second string selection line SSL2, and the second ground selection line GSL2 may be selected. Accordingly, an operation of programming the memory cells that are connected to the first word line WL1 and belong to the strings NS11 and NS12 to NS1n and an operation of programming the memory cells that are connected to the first word line WL1 and belong to the strings NS21 and NS22 to NS2n may be sequentially performed.

FIG. 7 is a diagram of a memory device 100a including a page buffer unit 150a having a quadruple bit line (QBL) structure according to some embodiments of the inventive concept.

Referring to FIG. 7, the memory cell array 110a may be connected to a plurality of bit lines BL1 to BL_4i. Here, i may be an integer greater than or equal to 3. The page buffer unit 150a may include a plurality of page buffers 151a to 153a. In some embodiments of the inventive concept, the number of the plurality of page buffers 151a to 153a may be i, and the number of bit lines BL1 to BL_4i may be 4i. In this case, four bit lines (e.g., BL1 to BL4) may be connected to one page buffer (e.g., 151a). Thus, the page buffer unit 150a may be referred to as a QBL-type page buffer.

In the present embodiment, the plurality of bit lines BL1 to BL_4i may be divided into first to fourth bit line groups BLG1 to BLG4, and sequential program orders of the first to fourth bit line groups BLG1 to BLG4 may be different from one another. For example, the first bit line group BLG1 may include bit lines BL1, BL5, and BL_4i−3, the second bit line group BLG2 may include bit lines BL2, BL6, and BL_4i−2, the third bit line group BLG3 may include bit lines BL3, BL7, and BL_4i−1, and the fourth bit line group BLG4 may include bit lines BL4, BL8, and BL_4i.

For example, one page buffer 151a may be shared among the first to fourth bit lines BL1 to BL4 included in the first to fourth bit line groups BLG1 to BLG4, respectively. In this case, program operations may be sequentially performed on the first to fourth bit line groups BLG1 to BLG4. In other words, program operations may be sequentially performed on memory cells connected to the first to fourth bit lines BL1 to BL4. A method of programming a memory device 100a including the page buffer unit 150a having a QBL structure will chiefly be described herein. However, the inventive concept is not limited thereto and may be also applied to a memory device including a page buffer unit having a structure shown in one of FIGS. 8 and 9.

Figure 8:
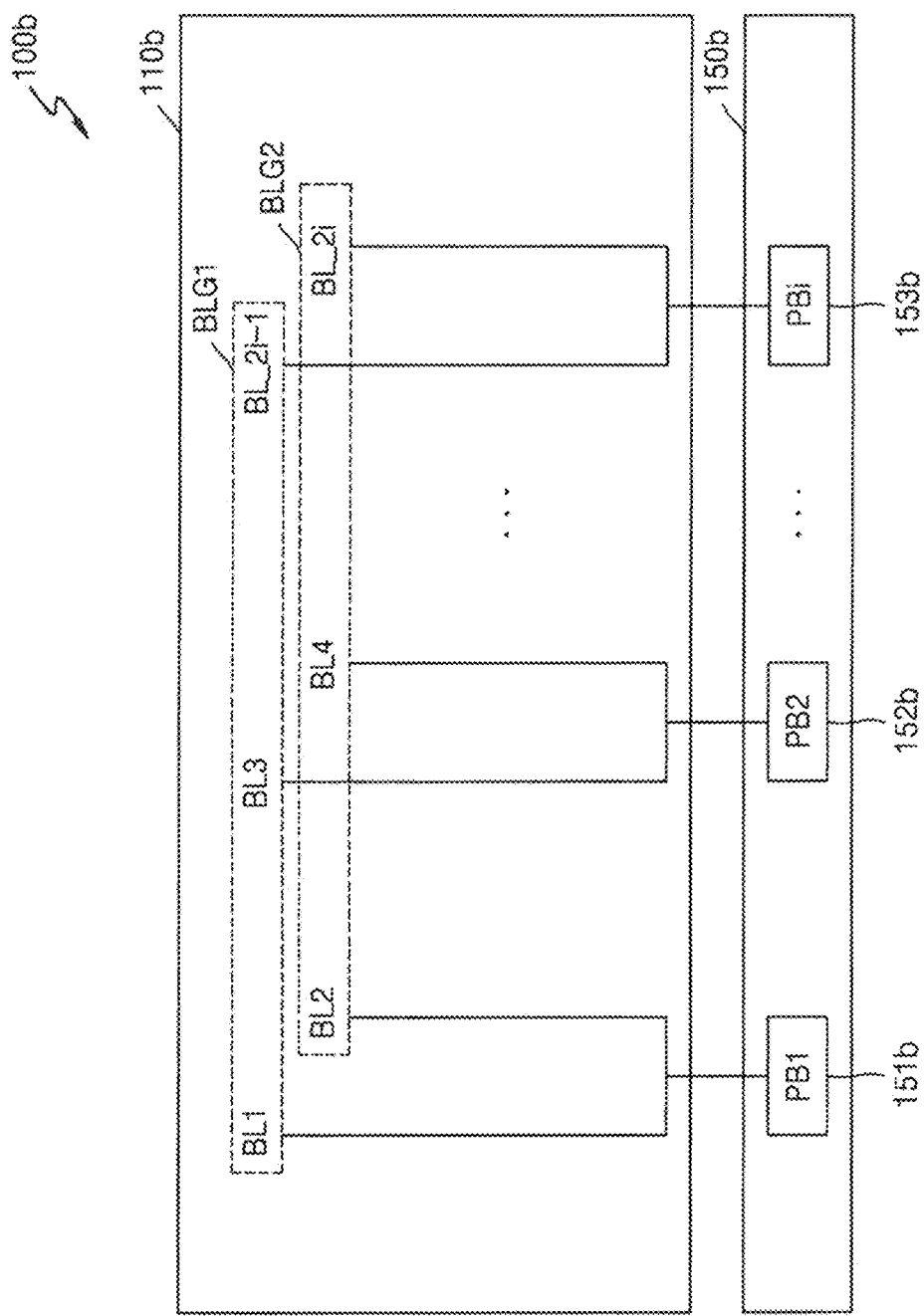
FIG. 8 is a diagram of a memory device including a page buffer unit having a shielded bit line (SBL) structure according to some embodiments of the inventive concept.

FIG. 8 is a diagram of a memory device 100b including a page buffer unit 150b having a shielded bit line (SBL) according to some embodiments of the inventive concept.

Referring to FIG. 8, the memory cell array 110b may be connected to a plurality of bit lines BL1 to BL_2i. Here, i may be an integer greater than or equal to 3. The page buffer unit 150b may include a plurality of page buffers 151b to 153b. In some embodiments of the inventive concept, the number of the plurality of page buffers 151b to 153b may be i, and the number of the plurality of bit lines BL1 to BL_2i may be 2i. In this case, two bit lines (e.g., BL1 and BL2) may be connected to one page buffer (e.g., 151b). Thus, the page buffer unit 150b may be referred to as an SBL-type page buffer.

In the present embodiment, the plurality of bit lines BL1 to BL_2i may be divided into first and second bit line groups BLG1 and BLG2, and sequential program orders of the first and second bit line groups BLG1 and BLG2 may be different from each other. For instance, the first bit line group BLG1 may include bit lines BL1, BL3, and BL_2i−1, and the second bit line group BLG2 may include bit lines BL2, BL4, and BL_2i. For example, one page buffer 151b may be shared between the first and second bit lines BL1 and BL2 included in the first and second bit line groups BLG1 and BLG2, respectively. In this case, program operations may be sequentially performed on the first and second bit line groups BLG1 and BLG2. In other words, program operations may be sequentially performed on memory cells connected to the first and second bit lines BL1 and BL2.

Figure 9:
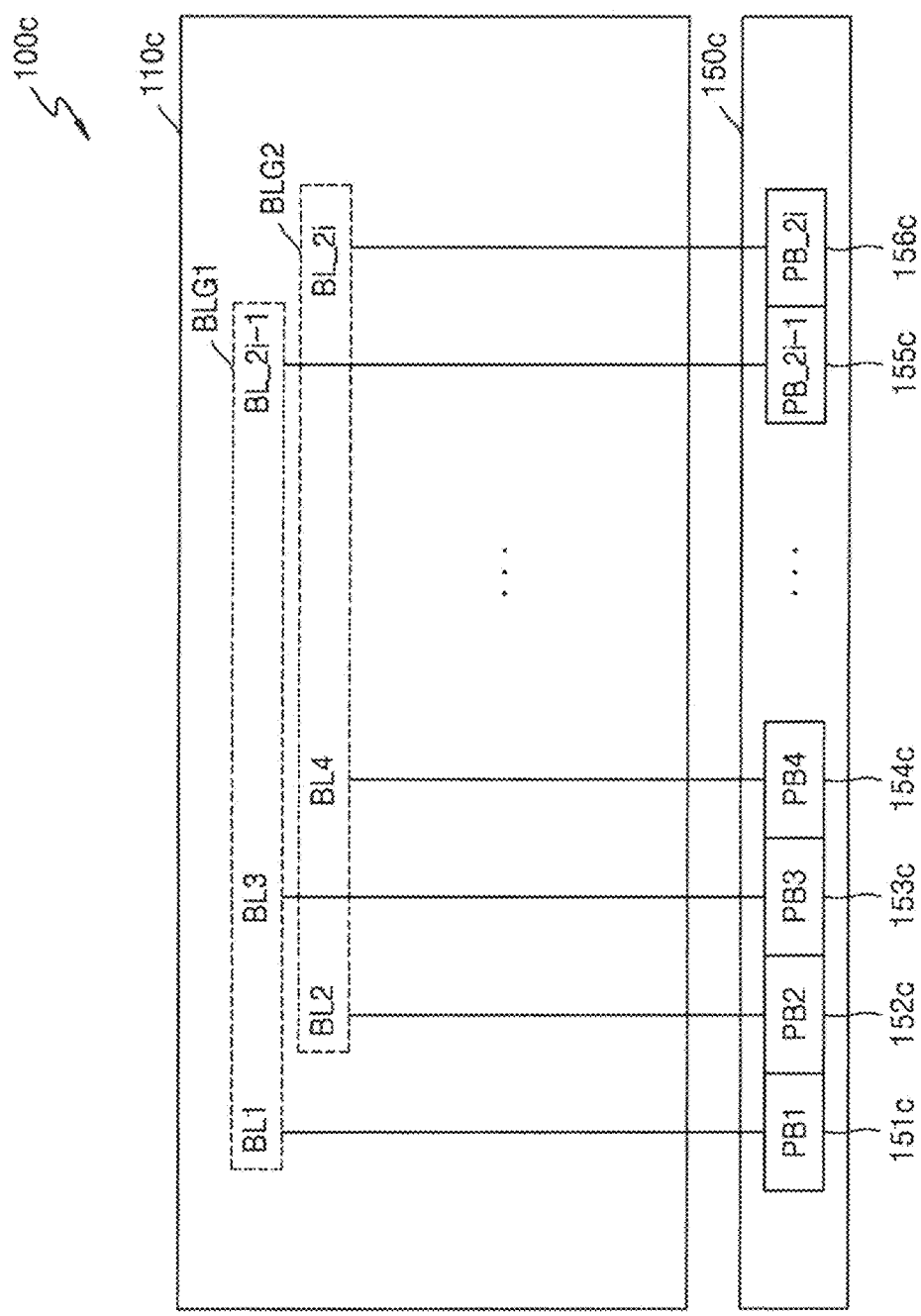
FIG. 9 is a diagram of a memory device including a page buffer unit having an all bit line (ABL) structure according to some embodiments of the inventive concept.

FIG. 9 is a diagram of a memory device 100c including a page buffer unit 150c having an all bit line (ABL) structure according to some embodiments of the inventive concept.

Referring to FIG. 9, the memory cell array 110c may be connected to a plurality of bit lines BL1 to BL_2i. Here, i is an integer greater than or equal to 3. The page buffer unit 150c may include a plurality of page buffers 151c to 156c. In some embodiments of the inventive concept, the number of the plurality of page buffers 151c to 156c may be 2i, and the number of bit lines BL1 to BL_2i may be 2i. In this case, each bit line (e.g., BL1) may be connected to one page buffer (e.g., 151c). Thus, the page buffer unit 150c may be referred to as an ABL page buffer.

In the present embodiment, the plurality of bit lines BL1 to BL_2i may be divided into first and second bit line groups BLG1 and BLG2, and sequential program orders of the first and second bit line groups BLG1 and BLG2 may be different from each other. For example, the first bit line group BLG1 may include bit lines BL, BL3, and BL_2i−1, while the second bit line group BLG2 may include bit lines BL2, BL4, and BL2i. In this case, program operations may be sequentially performed on the first and second bit line groups BLG1 and BLG2. In other words, program operations may be sequentially performed on memory cells connected to the first and second bit lines BL1 and BL2. However, the inventive concept is not limited thereto, and the plurality of bit lines BL1 to BL_2*i* may be divided into at least three bit line groups.

FIG. 10 is a circuit diagram showing program bias conditions according to some embodiments of the inventive concept. FIG. 11 is a diagram of a memory device corresponding to the circuit diagram of FIG. 10 according to some embodiments of the inventive concept. Hereinafter, the program bias conditions will be described with reference to FIGS. 10 and 11.

Referring to FIG. 10, a memory block BLKa' may include a plurality of strings connected respectively to intersections at which first to fourth bit lines BL to BL4 intersect first to fourth string selection lines SSL1 to SSL4. The memory block BLKa' may correspond to some of the memory blocks BLKa shown in FIG. 4. In the present embodiment, a selected memory cell to be programmed may be a memory cell MC1, and a fifth word line WL5, a first bit line BL1, and a first string selection line SSL1 may be selected. In this case, sixteen memory cells MC1 to MC16 connected to the fifth word line WL5, the first to fourth bit lines BL1 to BL4, and the first to fourth string selection lines SSL1 to SSL4 will be referred to as a "memory group". Sixteen program operations may be sequentially performed to program the sixteen memory cells MC1 to MC16 included in the memory group.

FIG. 11 illustrates word lines WL1 to WL8, which are connected to a plurality of strings that share the first bit line BL1 therebetween, the first to fourth string selection lines SSL1 to SSL4, and the first to fourth ground selection lines GSL1 to GSL4. In this case, word lines located at the same level in a third direction (e.g., a Z direction) may be shared among the first to fourth string selection lines SSL1 to SSL4. The first string selection line SSL1 may be a selected string selection line SSL_SEL, and the second to fourth string selection lines SSL2 to SSL4 may be unselected string selection lines SSL_UN. The first ground selection line GSL1 may be a selected ground selection line GSL_SEL, and the second to fourth ground selection lines GSL2 to GSL4 may be unselected ground selection lines GSL_UN. The fifth word line WL5 may be a selected word line WL_SEL, and the first to fourth word lines WL1 to WL4 and the sixth to eighth word lines WL6 to WL8 may be unselected word lines WL_UN.

As shown in FIG. 11, in a 3D memory device, since a plurality of word lines located at the same level in the third direction are connected to one another, the same voltage may be applied to the plurality of word lines located at the same level in the third direction. Thus, a program voltage Vpgm may be applied to gates of the unselected memory cells MC2 to MC16 that are connected to the selected fifth word line WL5. Accordingly, to inhibit a program operation on the unselected memory cells MC2 to MC16, program bias conditions under which voltages applied to the first to fourth string selection lines SSL1 and SSL4, the first to fourth ground selection lines GSL1 and GSL4, and the first to fourth bit lines BL1 to BL4 are individually determined may be used. Hereinafter, the program bias conditions will be described in detail.

According to the program bias conditions, a program voltage Vpgm may be applied to the selected fifth word line WL5, and a pass voltage Vpass may be applied to unselected word lines, that is, the fourth and sixth word lines WL4 and WL6. Also, a voltage of about 0V may be applied to the selected first bit line BL1, and a power supply voltage VDD may be applied to the unselected second to fourth bit lines BL2 to BL4. Also, a power supply voltage VDD may be applied to the selected first string selection line SSL1, and a voltage of about 0V may be applied to the unselected second to fourth string selection lines SSL2 to SSL4. A voltage of about 0V may be applied to the ground selection lines GSL1 and GSL4, and a voltage (e.g., VDD) higher than 0V may be applied to a common source line CSL.

In the above-described program bias conditions, a program voltage Vpgm may be applied to a gate of the selected memory cell MC1, and a channel voltage may be about 0V. Thus, since a strong electric field is generated between the gate and channel of the selected memory cell MC1, electrons in the channel may be injected into a charge trap layer due to Fowler-Nordheim (FN) tunneling so that the selected memory cell MC1 may be programmed. Meanwhile, since channels of the unselected memory cells MC2 to MC16 remain floated, a channel voltage may rise to a boosting voltage. Thus, since a sufficient electric field for causing FN tunneling is not generated between the gate and channel of each of the unselected memory cells MC2 to MC16, the unselected memory cells MC2 to MC16 may not be programmed.

For example, first and second strings NSa and NSb may be connected to the unselected fourth bit line BL4 and include first and second string selection transistors SSTa and SSTb, respectively. Channel voltages of the first and second strings NSa and NSb may rise to a boosting voltage (e.g., Vpass). Since a power supply voltage VDD is applied to a gate of the first string selection transistor SSTa, a magnitude of a voltage between the gate and channel of the first string selection transistor SSTa may correspond to "Vpass-VDD". Meanwhile, since a voltage of about 0V is applied to a gate of the second string selection transistor SSTb, a magnitude of a voltage between the gate and channel of the second string selection transistor SSTb may correspond to "Vpass".

In this case, since the magnitude (i.e., Vpass) of the voltage between the gate and channel of the second string selection transistor SSTb is greater than the magnitude (i.e., Vpass-VDD) of the voltage between the gate and channel of the first string selection transistor SSTa, hot carrier injection (HCI) may be more likely to occur in the second string selection transistor SSTb than in the first string selection transistor SSTa. As a result, a channel voltage of the first string NSa remains a boosting voltage, while a channel voltage of the second string NSb may become lower than the boosting voltage. Hereinafter, a difference in FN stress between the memory cells MC4 and MC16 that are respectively included in the first and second strings NSa and NSb and connected to the selected fifth word line WL5 will be described with reference to FIG. 12.

Figure 12:
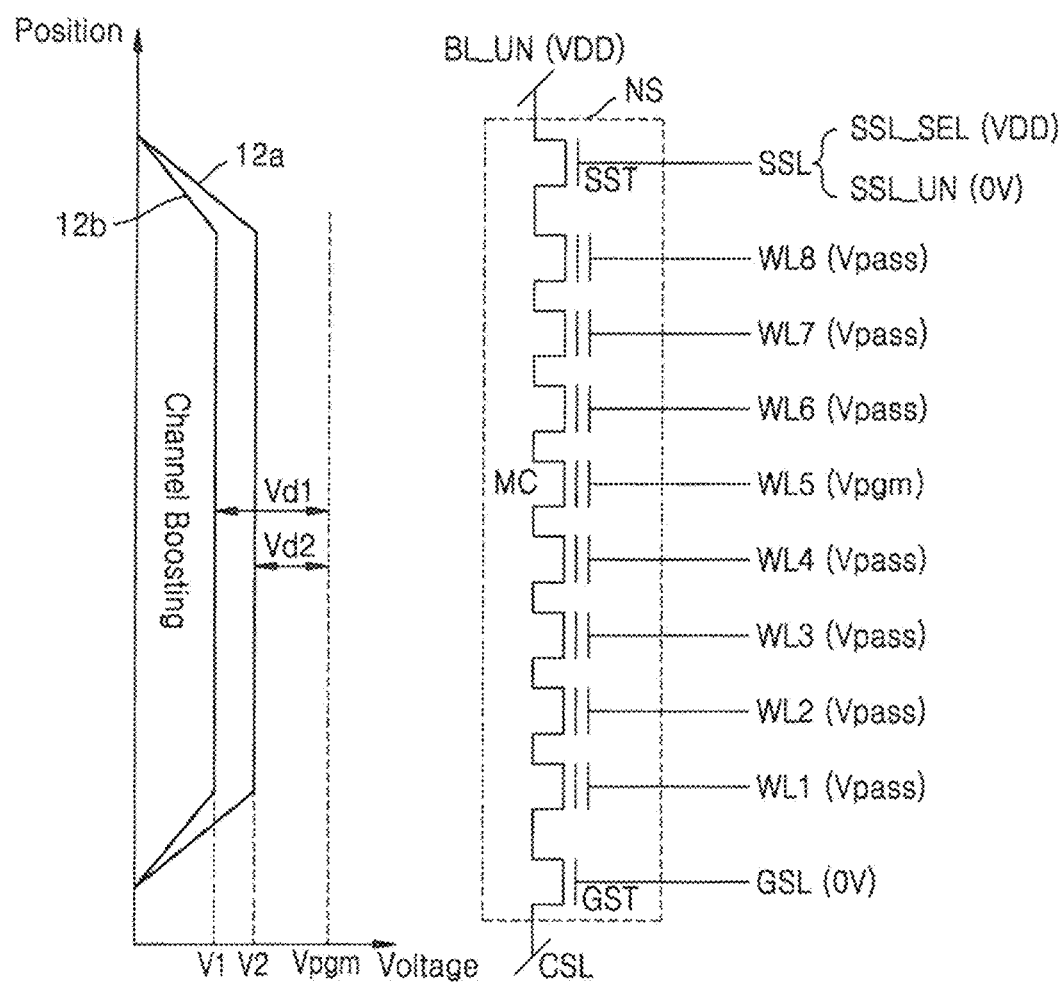
FIG. 12 illustrates an example of a channel boosting potential of a string connected to an unselected bit line of FIG. 10 according to some embodiments of the inventive concept.

FIG. 12 illustrates an example of a channel boosting potential of a string NS connected to an unselected bit line BL_UN of FIG. 10 according to some embodiments of the inventive concept. Hereinafter, FIG. 12 will be described with reference to FIGS. 10 and 11.

Referring to FIG. 12, the unselected bit line BL_UN may correspond to one of the second to fourth bit lines BL2 to BL4 of FIG. 10. For example, when a selected string selection line SSL_SEL is connected to the string selection transistor SST as in the first string NSa of FIG. 10, a channel voltage 12*a* may boost to a second voltage V2. In this case, the second voltage V2 may correspond to a pass voltage Vpass. Since a program voltage Vpgm is applied to a gate of the memory cell MC connected to the selected fifth word line WL5, a voltage Vd2 between the gate and channel of the memory cell MC may correspond to "Vpgm-V2". Accordingly, the memory cell MC may sustain relatively weak FN stress corresponding to Vpgm-V2.

For example, when the unselected string selection line SSL_UN is connected to the string selection transistor SST as in the second string NSb of FIG. 10, a channel voltage 12b may correspond to a first voltage V1 that is lower than the second voltage V2. Since the program voltage Vpgm is applied to the gate of the memory cell MC connected to the selected fifth word line WL5, a voltage Vd1 between the gate and channel of the memory cell MC may correspond to "Vpgm-V1". Here, Vd1 may be greater than Vd2. Accordingly, the memory cell MC may sustain relatively high FN stress corresponding to Vpgm-V1.

Figure 13:
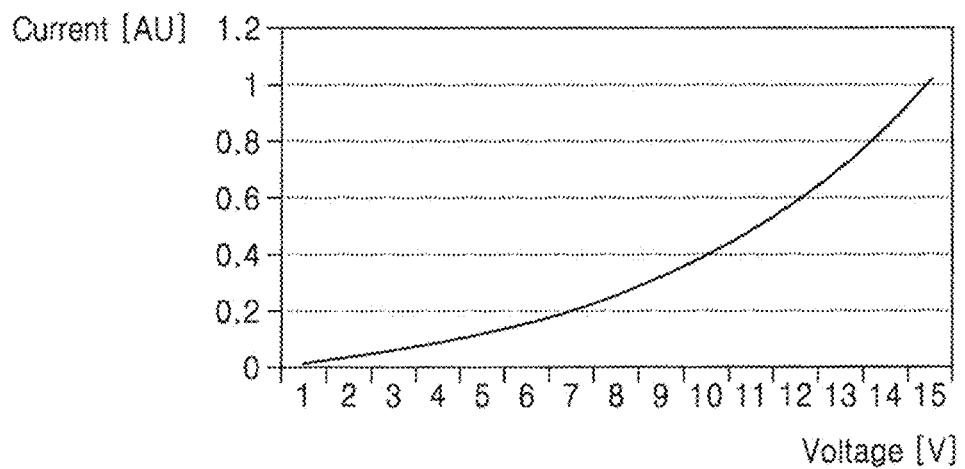
FIG. 13 is a graph of FN current relative to a voltage between a gate and a channel of a memory cell according to some embodiments of the inventive concept.

FIG. 13 is a graph of FN current relative to a voltage between a gate and a channel of a memory cell, according to some embodiments of the inventive concept. Hereinafter, the graph of FIG. 13 will be described with reference to FIG. 12. In FIG. 13, an abscissa denotes a voltage between a gate and a channel of a memory cell by voltage units, and an ordinate denotes FN current flowing through the memory cell by arbitrary unit (A.U.). Here, FN current may flow in a direction of the channel into the memory cell according to a voltage between the gate and the channel of the memory cell. As shown in FIG. 13, as a voltage between a gate and a channel of a memory cell increases, FN current may nonlinearly increase.

A channel voltage V1 of a string connected to an unselected string selection line SSL_UN may be lower than a channel voltage V2 of a string connected to a selected string selection line SSL_SEL. Accordingly, since a voltage Vd1 between a gate and a channel of a memory cell included in the string connected to the unselected string selection line SSL_UN is greater than a voltage Vd2 between a gate and a channel of a memory cell included in the string connected to the selected string selection line SSL_SEL, a larger FN current may flow into the memory cell included in the string connected to the unselected string selection line SSL_UN than in the memory cell included in the string connected to the selected string selection line SSL_SEL. As a result, a relatively strong FN stress may be applied to the memory cell included in the string connected to the unselected string selection line SSL_UN, while a relatively weak FN stress may be applied to the memory cell included in the string connected to the selected string selection line SSL_SEL.

When the strong FN stress is applied to the memory cell, a relatively large FN current may flow into the memory cell so that a threshold voltage of the memory cell may rise. Thus, when a weak FN stress is subsequently applied to the memory cell, the influence of the FN stress upon a channel voltage may be reduced so that program disturbance may decrease. Meanwhile, when a weak FN stress is applied to the memory cell, a relatively small FN current may flow into the memory cell so that a threshold voltage of the memory cell may not noticeably rise. Thus, when a strong FN stress is subsequently applied to the memory cell, a relatively large FN current may flow so that program disturbance may increase.

Therefore, in consideration of program disturbances, it may be effective to apply a weak FN stress to the memory cell after applying a strong FN stress to the memory cell. To this end, according to some embodiments of the inventive concept, the largest possible number of string selection lines may be firstly unselected so that memory cells may suffer strong FN stress. Subsequently, the string selection lines may be selected to scramble a string selection line address and a bit line group address so that the memory cells may suffer weak FN stress. Thus, program disturbances may be reduced or possibly be minimized. This address scramble operation will be described in detail below.

Figure 14:
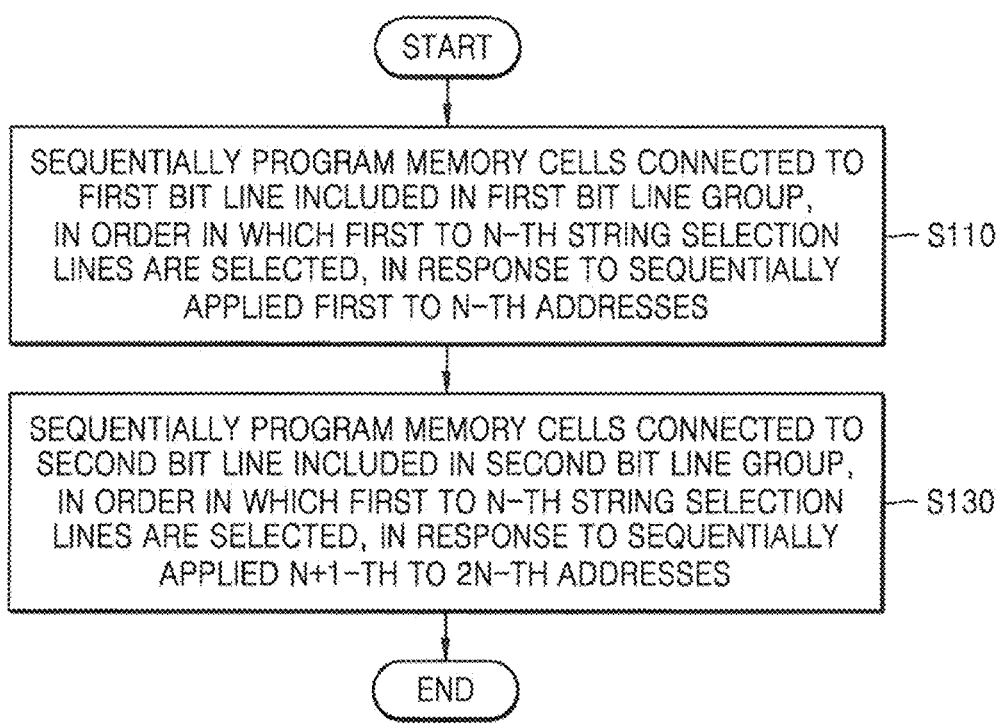
FIG. 14 is a flowchart of a method of programming a non-volatile memory device according to some embodiments of the inventive concept.
Figure 15A:
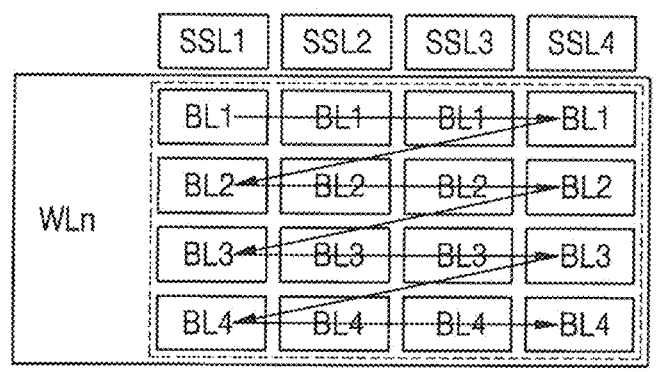

FIG. 14 is a flowchart of a method of programming a non-volatile memory device according to some embodiments of the inventive concept. FIGS. 15A and 15B illustrate a sequential program order of the non-volatile memory device according to some embodiments of the inventive concept. Hereinafter, the method of programming the non-volatile memory device according to the present embodiment will be described in detail with reference to FIGS. 14 to 15B.

Referring to FIG. 14, the present embodiment may pertain to a method of programming a non-volatile memory device including a plurality of string selection lines, which may share a word line, and a plurality of bit line groups. For example, the method of programming the non-volatile memory device according to the present embodiment may be performed in a temporal sequence by the memory device 100 of FIG. 2. The descriptions presented above with reference to FIGS. 1 to 13 may be applied to the present embodiment.

In operation S110, in response to sequentially applied first to N-th addresses, memory cells connected to a first bit line BL1 included in a first bit line group may be sequentially programmed in an order in which first to N-th string selection lines are selected. For example, the first to N-th string selection lines may include first to fourth string selection lines SSL1 to SSL4. For instance, a memory cell connected to the first bit line BL1 and the first string selection line SSL1 may be programmed, then a memory cell connected to the first bit line BL1 and the second string selection line SSL2 may be programmed, then a memory cell connected to the first bit line BL1 and the third string selection line SSL3 may be programmed, and then a memory cell connected to the first bit line BL1 and the fourth string selection line SSL4 may be programmed as illustrated in FIGS. 15A and 15B. In some embodiments, the memory cells connected to the first bit line BL1 included in the first bit line group may be sequentially programmed by sequentially selecting the N string selection lines in response to sequentially applied the first to N-th addresses as illustrated in FIGS. 15A and 15B.

In operation S130, in response to sequentially applied N+1-th to 2N-th addresses, memory cells connected to a second bit line BL2 included in a second bit line group may be sequentially programmed in an order in which the first to N-th string selection lines are selected. For example, a memory cell connected to the second bit line BL2 and the first string selection line SSL1 may be programmed, then a memory cell connected to the second bit line BL2 and the second string selection line SSL2 may be programmed, then a memory cell connected to the second bit line BL2 and the third string selection line SSL3 may be programmed, and then a memory cell connected to the second bit line BL2 and the fourth string selection line SSL4 may be programmed as illustrated in FIGS. 15A and 15B. In some embodiments, the memory cells connected to the second bit line BL2 included in the second bit line group may be sequentially programmed by sequentially selecting the N string selection lines in response to sequentially applied the N+1-th to 2N-th addresses as illustrated in FIGS. 15A and 15B. In some embodiments, the memory cells connected to the second bit line BL2 included in the second bit line group may be programmed after the memory cells connected to the first bit line BL1 included in the first bit line group are programmed.

In some embodiments of the inventive concept, the first bit line group may include a plurality of first bit lines, and memory cells connected to the same word line and the same string selection line among memory cells connected to the plurality of first bit lines may be simultaneously programmed. In some embodiments of the inventive concept, memory cells connected to the first bit line group, among the memory cells connected to the same word line and the same string selection line, may be programmed before memory cells connected to the second bit line group. It will be understood that "simultaneously programmed" (or similar language) refers to programmed at approximately (but not necessarily exactly) the same time.

Figure 16:
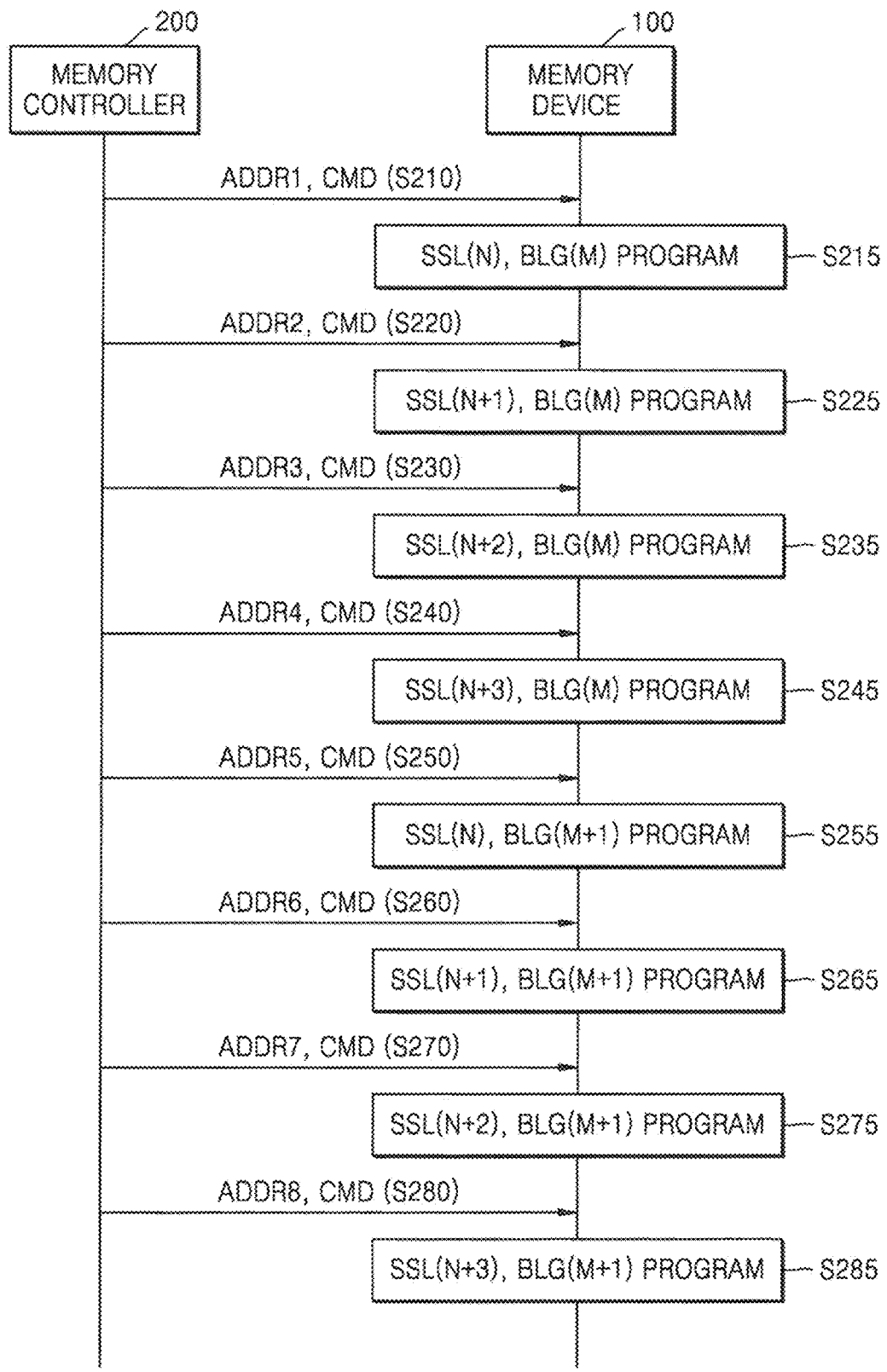
FIG. 16 is a flowchart of operations of a memory controller and a memory device by using a method of programming a non-volatile memory device according to some embodiments of the inventive concept.

FIG. 16 is a flowchart of operations of a memory controller 200 and a memory device 100 by using a method of programming a non-volatile memory device according to some embodiments of the inventive concept. For example, the non-volatile memory device may include four string selection lines and two bit line groups. In this case, in the flowchart of FIG. 16, N may be 1, and M may be 1.

Referring to FIG. 16, in operation S210, the memory device 100 may receive a first address ADDR1 and a program command CMD from the memory controller 200. Also, the memory device 100 may further receive data to be programmed, from the memory controller 200. In operation S215, the memory device 100 may program a memory cell connected to an n-th word line WLn, a first string selection line SSL(N), and a bit line included in a first bit line group BLG(M). In operation S220, the memory device 100 may receive a second address ADDR2 and a program command CMD. In operation S225, the memory device 100 may program a memory cell connected to the n-th word line WLn, a second string selection line SSL(N+1), and the bit line included in the first bit line group BLG(M). In operation S230, the memory device 100 may receive a third address ADDR3 and the program command CMD. In operation S235, the memory device 100 may program a memory cell connected to the n-th word line WLn, a third string selection line SSL(N+2), and the bit line included in the first bit line group BLG(M). In operation S240, the memory device 100 may receive a fourth address ADDR4 and the program command CMD. In operation S245, the memory device 100 may program a memory cell connected to the n-th word line WLn, a fourth string selection line SSL(N+3), and the bit line included in the first bit line group BLG(M).

In operation S250, the memory device 100 may receive a fifth address ADDR5 and the program command CMD. In operation S255, the memory device 100 may program a memory cell connected to the n-th word line WLn, the first string selection line SSL(N), and a bit line included in a second bit line group BLG(M+1). In operation S260, the memory device 100 may receive a sixth address ADDR6 and the program command CMD. In operation S265, the memory device 100 may program a memory cell connected to the n-th word line WLn, the second string selection line SSL(N+1), and the bit line included in the second bit line group BLG(M+1). In operation S270, the memory device 100 may receive a seventh address ADDR7 and the program command CMD. In operation S275, the memory device 100 may program a memory cell connected to the n-th word line WLn, the third string selection line SSL(N+2), and the bit line included in the second bit line group BLG(M+1). In operation S280, the memory device 100 may receive an eighth address ADDR8 and the program command CMD. In operation S285, the memory device 100 may program a memory cell connected to the n-th word line WLn, the fourth string selection line SSL(N+3), and the bit line included in the second bit line group BLG(M+1).

Figure 17A:
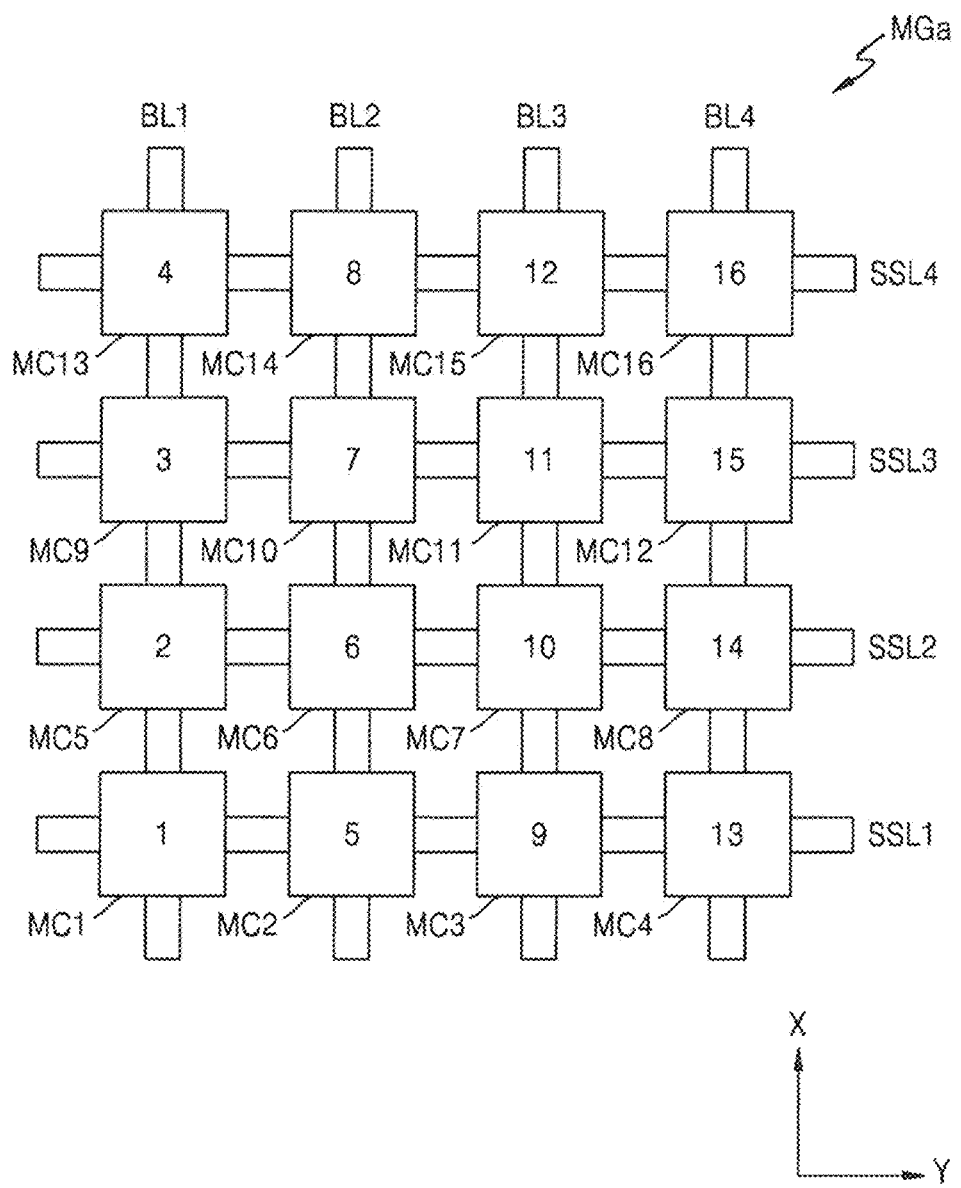
FIGS. 17A to 17C illustrate examples of a sequential program order of a memory group when four bit line groups are provided according to some embodiments of the inventive concept.

FIG. 17A illustrates a sequential program order of a memory group MGa when four bit line groups are provided, according to some embodiments of the inventive concept. In FIG. 17A, numbers provided in respective memory cells MC1 to MC16 indicate ordinal numbers that tell the sequential program order.

Referring to FIG. 17A, the memory group MGa may include memory cells MC1 to MC16, which may be connected in common to an n-th word line. For example, the memory cells MC1 to MC16 may correspond to memory cells MC1 to MC16, which may be connected to the selected fifth word line WL5 of FIG. 10. The first to fourth bit lines BL1 to BL4 may extend in, for example, an X direction and share one page buffer therebetween. Also, the first to fourth bit lines BL1 to BL4 may be included in the first to fourth bit line groups, respectively. Thus, sequential orders in which memory cells connected to the first to fourth bit lines BL1 to BL4 are programmed may be different from one another. The first to fourth string selection lines SSL1 to SSL4 may extend in, for example, a Y direction, and word lines located at the same level may be shared among the first to fourth string selection lines SSL1 to SSL4.

The memory cells MC1, MC5, MC9, and MC13 connected to the first bit line BL1 may be sequentially programmed, then the memory cells MC2, MC6, MC10, and MC14 connected to the second bit line BL2 may be sequentially programmed, then the memory cells MC3, MC7, MC11, and MC15 connected to the third bit line BL3 may be sequentially programmed, and then the memory cells MC4, MC8, MC12, MC16 connected to the fourth bit line BL4 may be sequentially programmed.

In some embodiments of the inventive concept, the memory cells MC1 to MC16 may be SLCs. However, the inventive concept is not limited thereto, and the memory cells MC1 to MC16 may be MLCs or TLCs. In this case, when a high-speed program (ISP) operation is performed on the memory cells MC1 to MC16, the memory cells MC1 to MC16 may be programmed according to the sequential program order shown in FIG. 17A. Although FIG. 17A illustrates a case in which program operations are sequentially performed on memory cells included in the same bit line from the first string selection line SSL1 toward the fourth string selection line SSL4, the inventive concept is not limited thereto. In some embodiments, program operations may be sequentially performed on the memory cells included in the same bit line from the fourth string selection line SSL4 toward the first string selection line SSL1. Hereinafter, various modified examples of sequential program orders will be described.

Figure 17B:
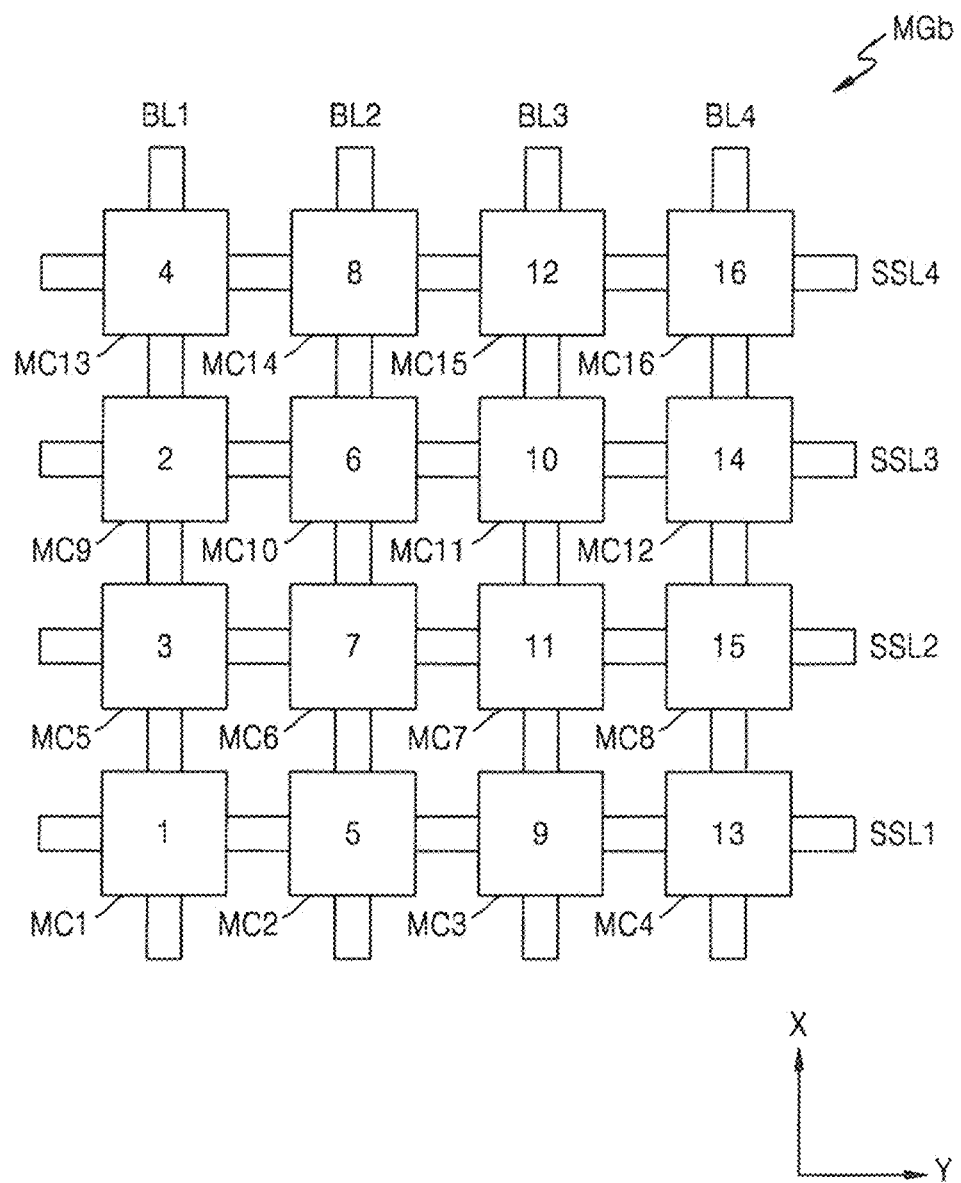

FIG. 17B illustrates a sequential program order of a memory group MGb when four bit line groups are provided, according to some embodiments of the inventive concept. In FIG. 17B, numbers provided in respective memory cells MC1 to MC16 indicate ordinal numbers that tell the sequential program order.

Referring to FIG. 17B, the memory group MGb may include memory cells MC1 to MC16, which may be connected in common to an n-th word line. The sequential program order of the memory group MGb as shown in FIG. 17B may correspond to a modified embodiment of the embodiment shown in FIG. 17A, and repeated descriptions will be omitted. For example, from among the memory cells MC1, MC5, MC9, and MC13 connected to the first bit line BL1, the memory cell MC1 may be firstly programmed, then the memory cell MC9 may be programmed, then the memory cell MC5 may be programmed, and then the memory cell MC13 may be programmed. Thus, according to the present embodiment, a sequential order in which the memory cells MC1, MC5, MC9, and MC13 connected to the first bit line BL1 are programmed may not correspond to an order in which string selection lines are selected.

Figure 17C:
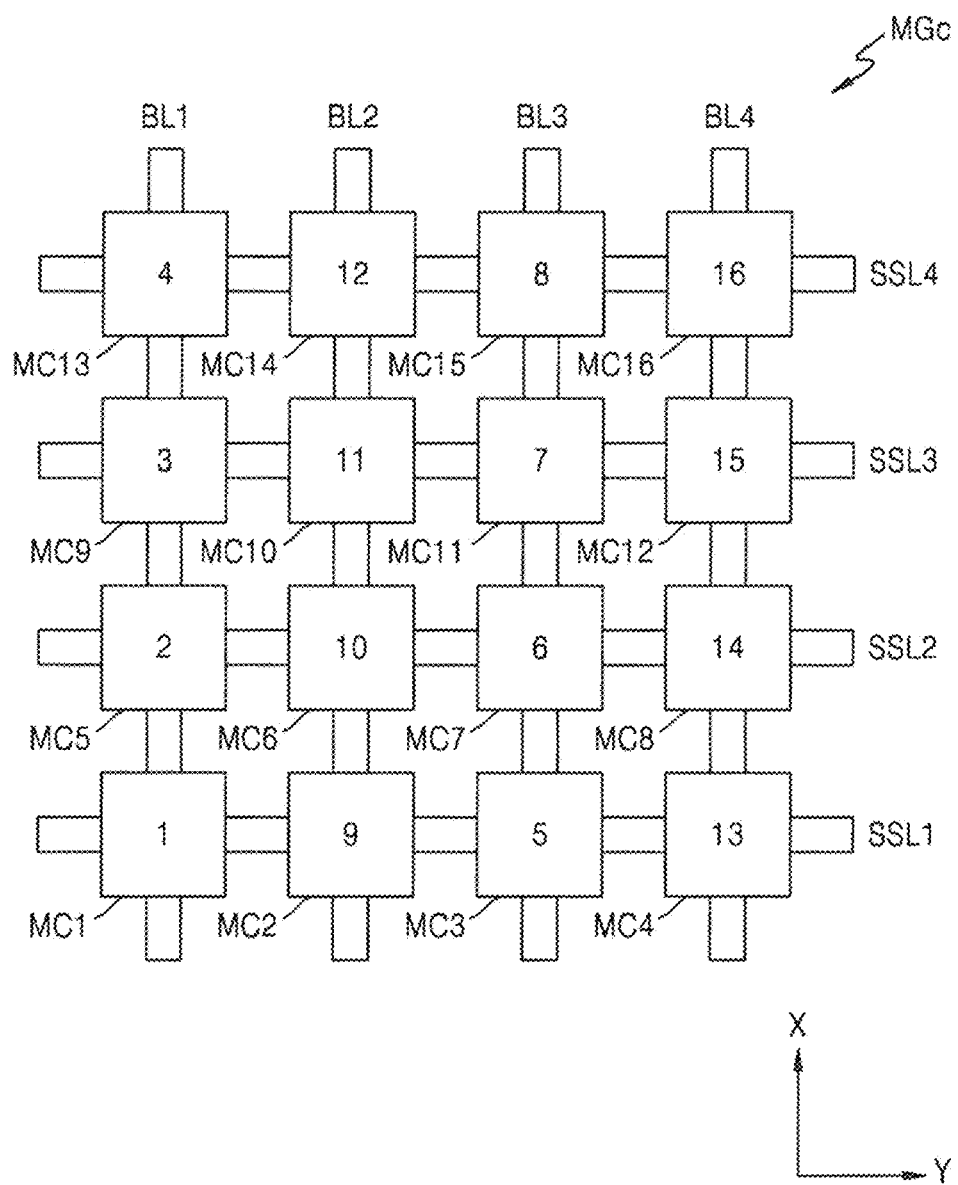

FIG. 17C illustrates a sequential program order of a memory group MGc when four bit line groups are provided, according to some embodiments of the inventive concept. In FIG. 17C, numbers provided in respective memory cells MC1 to MC16 indicate ordinal numbers that tell the sequential program order.

Referring to FIG. 17C, the memory group MGc may include memory cells MC1 to MC16, which may be connected in common to an n-th word line. The sequential program order of the memory group MGc as shown in FIG. 17C may correspond to a modified embodiment of the embodiment shown in FIG. 17A, and repeated descriptions will be omitted. For example, memory cells MC1, MC5, MC9, and MC13 connected to a first bit line BL1 may be sequentially programmed, then memory cells MC3, MC7, MC11, and MC15 connected to a third bit line BL3 may be sequentially programmed, then memory cells MC2, MC6, MC10, and MC14 connected to a second bit line BL2 may be sequentially programmed, and subsequently, memory cells MC4, MC8, MC12, and MC16 connected to a fourth bit line BL4 may be sequentially programmed. Thus, according to the present embodiment, a sequential order in which memory cells connected to bit lines included in respectively different bit line groups are programmed may not correspond to an order in which the bit lines are selected.

Figure 18:
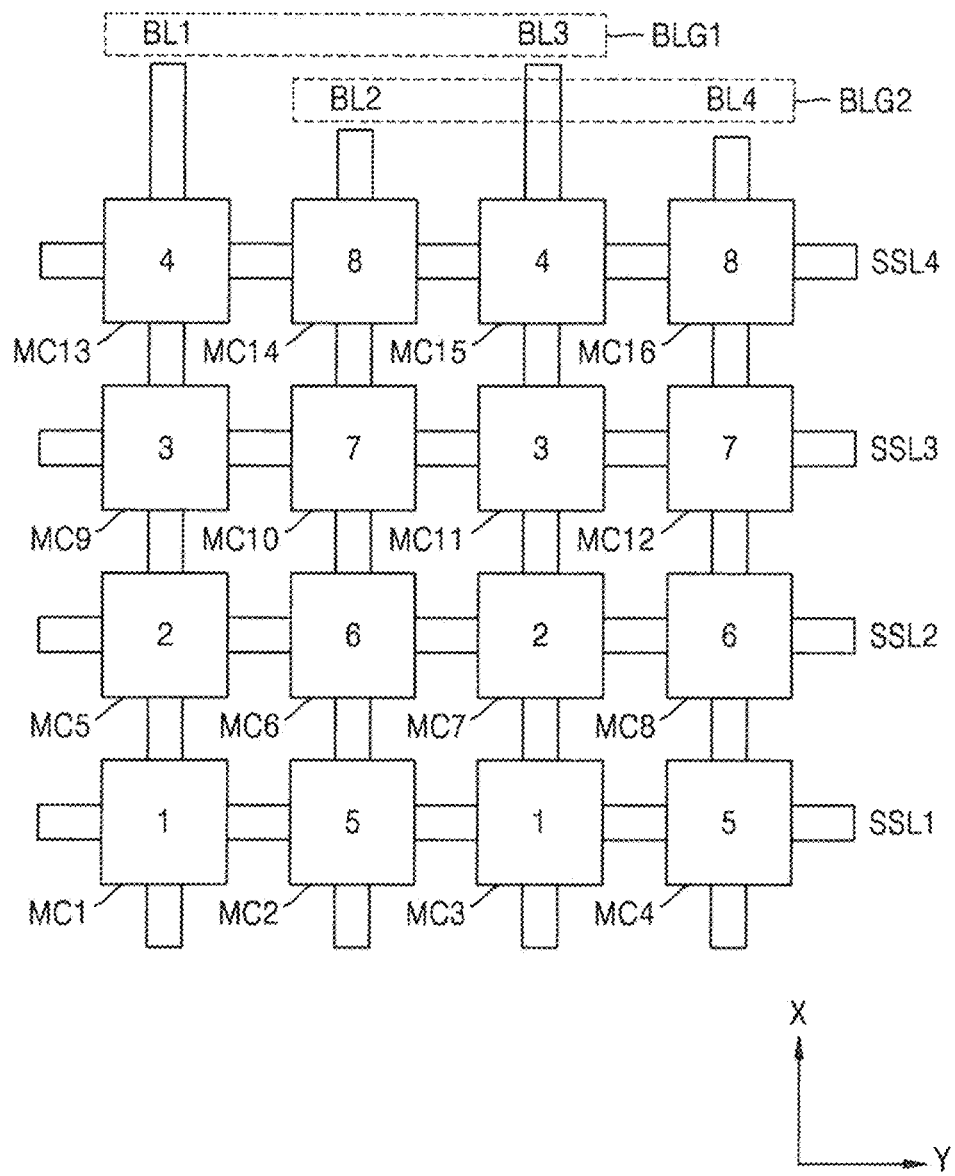
FIG. 18 illustrates a sequential order in which memory cells are programmed when two bit line groups are provided according to some embodiments of the inventive concept.

FIG. 18 illustrates a sequential order in which memory cells MC1 to MC16 are programmed when two bit line groups are provided, according to some embodiments of the inventive concept. In FIG. 18, numbers provided in the respective memory cells MC1 to MC16 indicate ordinal numbers that tell the sequential program order.

Referring to FIG. 18, first to fourth bit lines BL1 to BL4 may extend in, for example, an X direction, one page buffer may be shared between the first and third bit lines BL1 and BL3, and another page buffer may be shared between the second and fourth bit lines BL2 and BL4. Also, the first and the third bit lines BL1 and BL3 may be included in a first bit line group BLG1, and the second and fourth bit lines BL2 and BL4 may be included in a second bit line group BLG2. Thus, a sequential order in which memory cells connected to the first bit line group BLG1 are programmed may be different from a sequential order in which memory cells connected to the second bit line group BLG2 are programmed. The first to fourth string selection lines SSL1 to SSL4 may extend in, a Y direction, and word lines located at the same level may be shared among the first to fourth string selection lines SSL1 to SSL4.

In some embodiments of the inventive concept, the memory cells MC1 to MC16 may be SLCs. Memory cells MC1, MC5, MC9, MC13, MC3, MC7, MC11, and MC15 connected to the first and third bit lines BL1 and BL3 included in the first bit line group BLG1 may be firstly programmed, and then memory cells MC2, MC6, MC10, MC14, MC4, MC8, MC12, and MC16 connected to the second and fourth bit lines BL2 and BL4 included in the second bit line group BLG2 may be subsequently programmed. Specifically, the memory cells MC1 and MC3 may be simultaneously programmed, then the memory cells MC5 and MC7 may be simultaneously programmed, then the memory cells MC9 and MC11 may be simultaneously programmed, and then the memory cells MC13 and MC15 may be simultaneously programmed. Subsequently, the memory cells MC2 and MC4 may be simultaneously programmed, then the memory cells MC6 and MC8 may be simultaneously programmed, then the memory cells MC10 and MC12 may be simultaneously programmed, and then the memory cells MC14 and MC16 may be simultaneously programmed.

Figure 19:
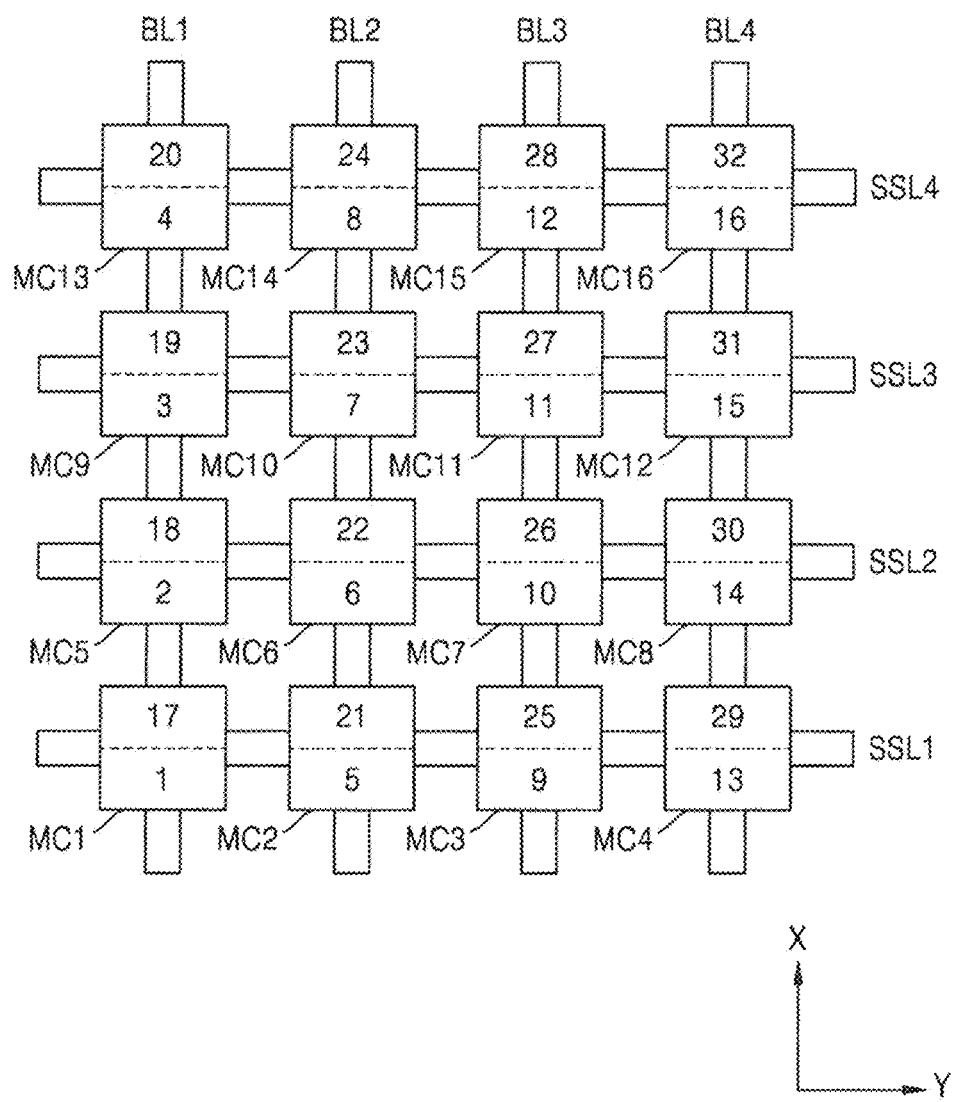
FIG. 19 illustrates a sequential order in which multi-level cells (MLCs) are programmed according to some embodiments of the inventive concept.

FIG. 19 illustrates a sequential order in which MLCs are programmed, according to some embodiments of the inventive concept. In FIG. 19, numbers provided in the respective memory cells MC1 to MC16 indicate ordinal numbers that tell the sequential program order.

Referring to FIG. 19, a sequential program order according to the present embodiment may correspond to a modified embodiment of the sequential program order shown in FIG. 17A, and repeated descriptions will be omitted. According to the present embodiment, the memory cells MC1 to MC16 may be MLCs and may be programmed by using a shadow program method. To begin with, least significant bit (LSB) program operations may be sequentially performed on the memory cells MC1 to MC16. In this case, the LSB program operations may be performed according to the sequential program order shown in FIG. 17A. Next, most significant bit (MSB) program operations may be sequentially performed on the memory cells MC1 to MC16. In this case, the MSB program operations may be performed according to the sequential program order shown in FIG. 17A.

Figure 20:
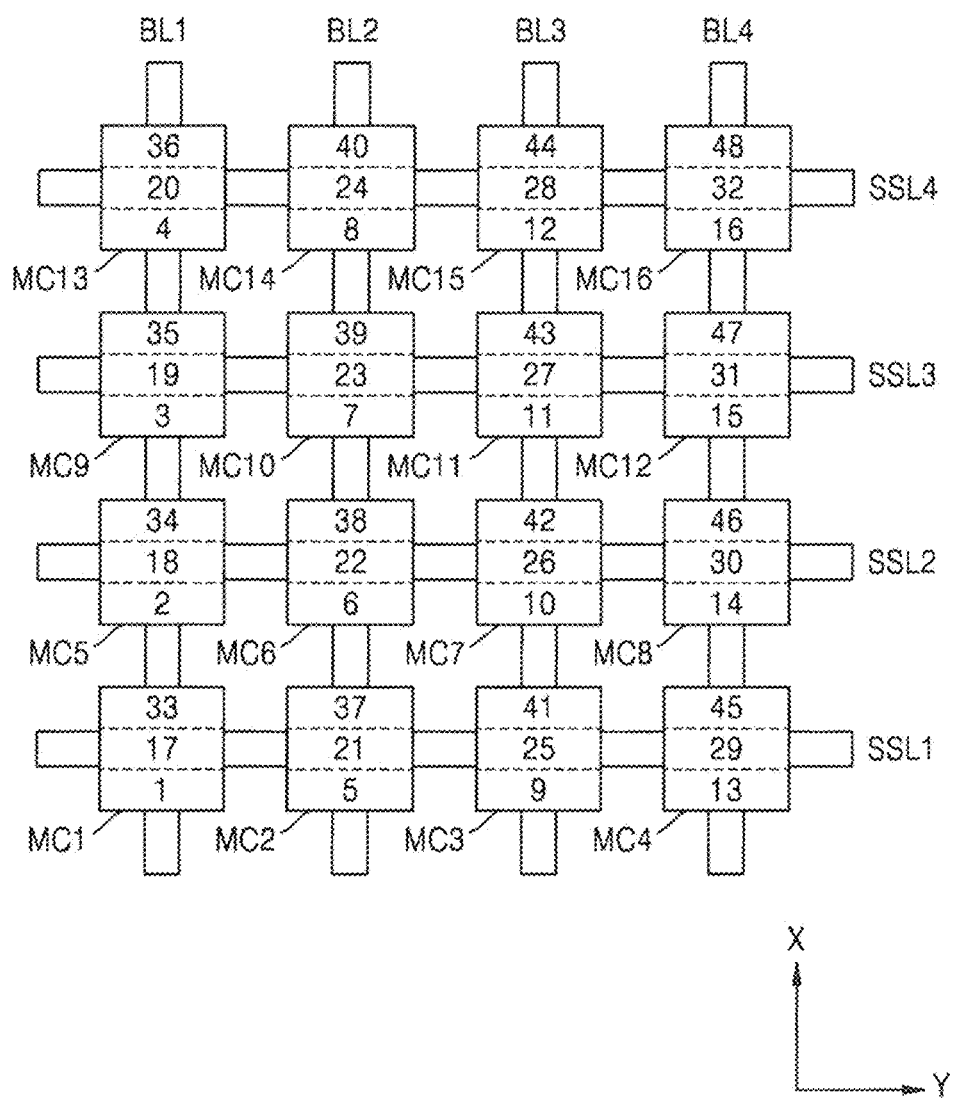
FIG. 20 illustrates a sequential order in which triple-level cells (TLCs) are programmed according to some embodiments of the inventive concept.

FIG. 20 illustrates a sequential order in which TLCs are programmed, according to some embodiments of the inventive concept. In FIG. 20, numbers provided in respective memory cells MC1 to MC16 indicate ordinal numbers that tell the sequential program order.

Referring to FIG. 20, a sequential program order according to the present embodiment may correspond to a modified embodiment of the sequential program order shown in FIG. 17A, and repeated descriptions will be omitted. According to the present embodiment, the memory cells MC1 to MC16 may be TLCs and may be programmed according to a shadow program method. To begin, LSB program operations may be sequentially performed on the memory cells MC1 to MC16. In this case, the LSB program operations may be performed according to the sequential program order shown in FIG. 17A. Next, central significant bit (CSB) program operations may be sequentially performed on the memory cells MC1 to MC16. In this case, the CSB program operations may be performed according to the sequential program order shown in FIG. 17A. Next, MSB program operations may be sequentially performed on the memory cells MC1 to MC16. In this case, the MSB program operations may be performed according to the sequential program order shown in FIG. 17A.

Figure 21:
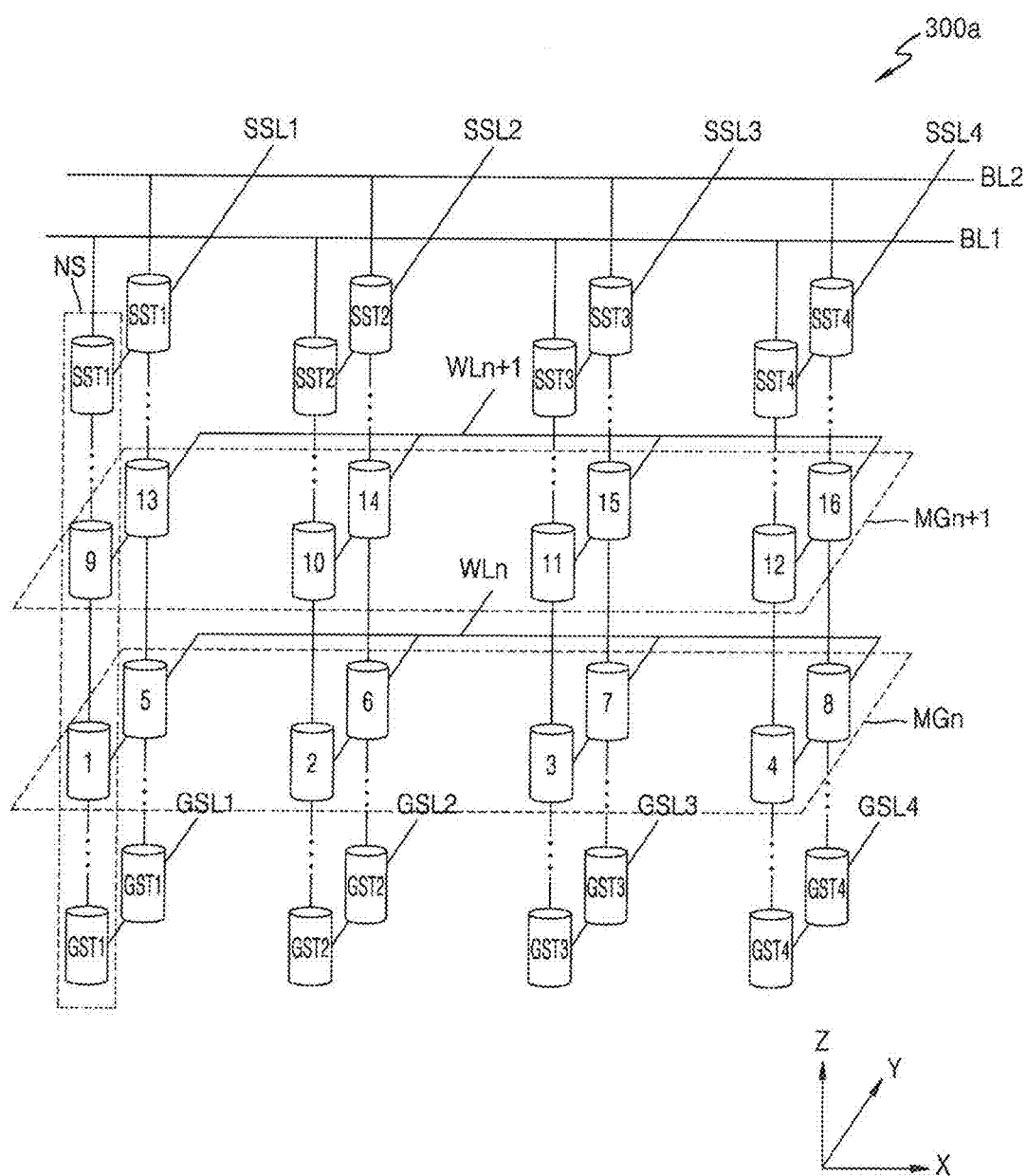
FIG. 21 illustrates a sequential program order of a three-dimensional (3D) memory device according to some embodiments of the inventive concept.

FIG. 21 illustrates a sequential program order of a 3D memory device 300a according to some embodiments of the inventive concept. In FIG. 21, numbers provided in respective memory cells indicate ordinal numbers that tell the sequential program order.

Referring to FIG. 21, the 3D memory device 300a may include first and second bit lines BL1 and BL2, first to fourth string selection lines SSL1 to SSL4, an n-th word line WLn, an n+1-th word line WLn+1, and first to fourth ground selection lines GSL1 to GSL4. Also, the 3D memory device 300a may include a plurality of strings NS connected respectively to intersections at which the first and second bit lines BL1 and BL2 intersect the first to fourth string selection lines SSL1 to SSL4.

In some embodiments of the inventive concept, an n-th memory group MGn including memory cells connected to the n-th word line WLn may be firstly programmed. Specifically, memory cells that are connected to the n-th word line WLn, the first bit line BL1, and the first to fourth string selection lines SSL1 to SSL4 may be sequentially programmed, and subsequently, memory cells that are connected to the n-th word line WLn, the second bit line BL2, and the first to fourth string selection lines SSL1 to SSL4 may be sequentially programmed. Thereafter, an n+1-th memory group MGn+1 including memory cells connected to the n+1-th word line WLn+1 may be programmed. Specifically, memory cells that are connected to the n+1-th word line WLn+1, the first bit line BL1, and the first to fourth string selection lines SSL1 to SSL4 may be sequentially programmed, and subsequently, memory cells that are connected to the n+1-th word line WLn+1, the second bit line BL2, and the first to fourth string selection lines SSL1 to SSL4 may be sequentially programmed.

Figure 22A:
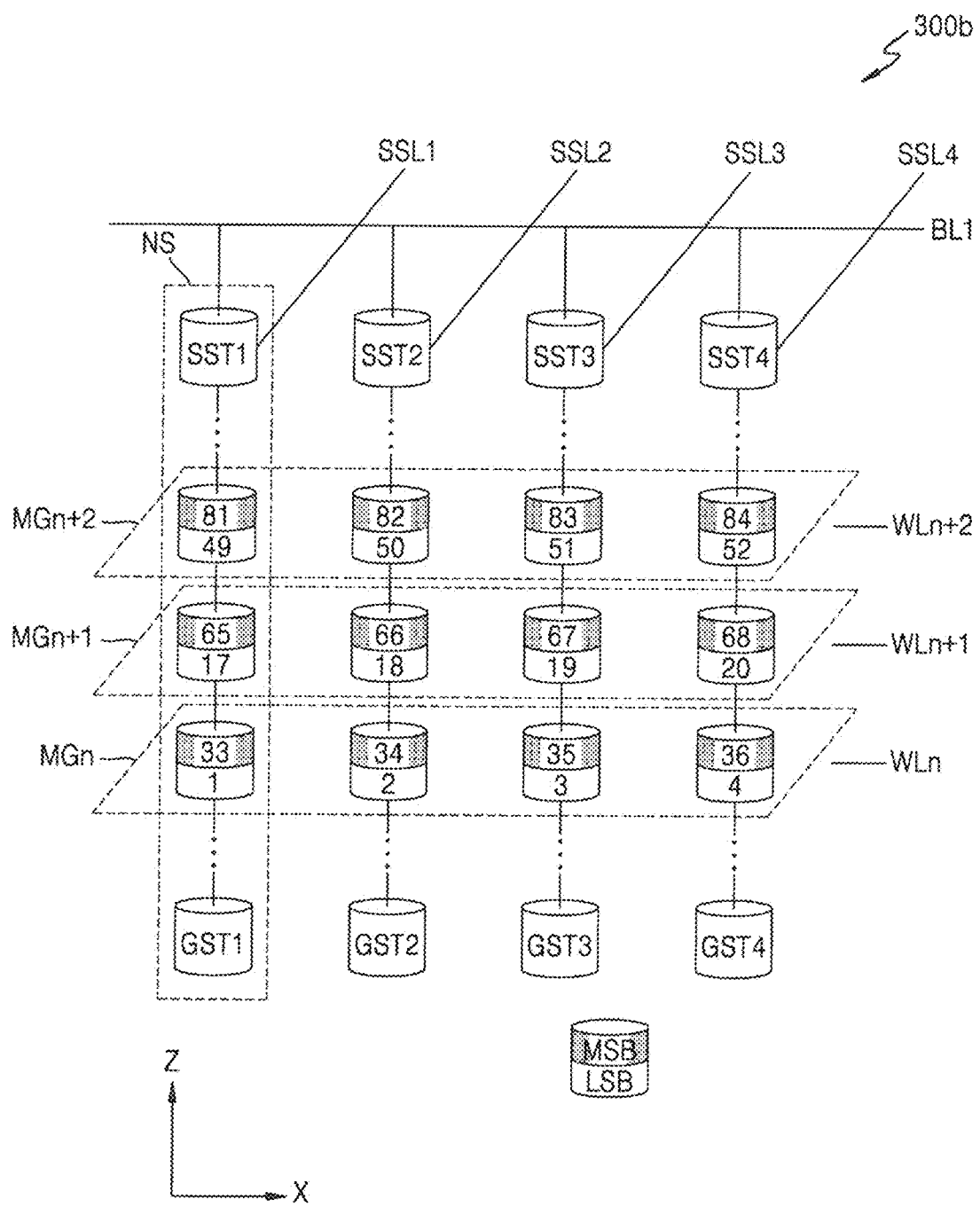
FIGS. 22A and 22B illustrate sequential program orders of a 3D memory device including MLCs according to some embodiments of the inventive concept.
Figure 22B:
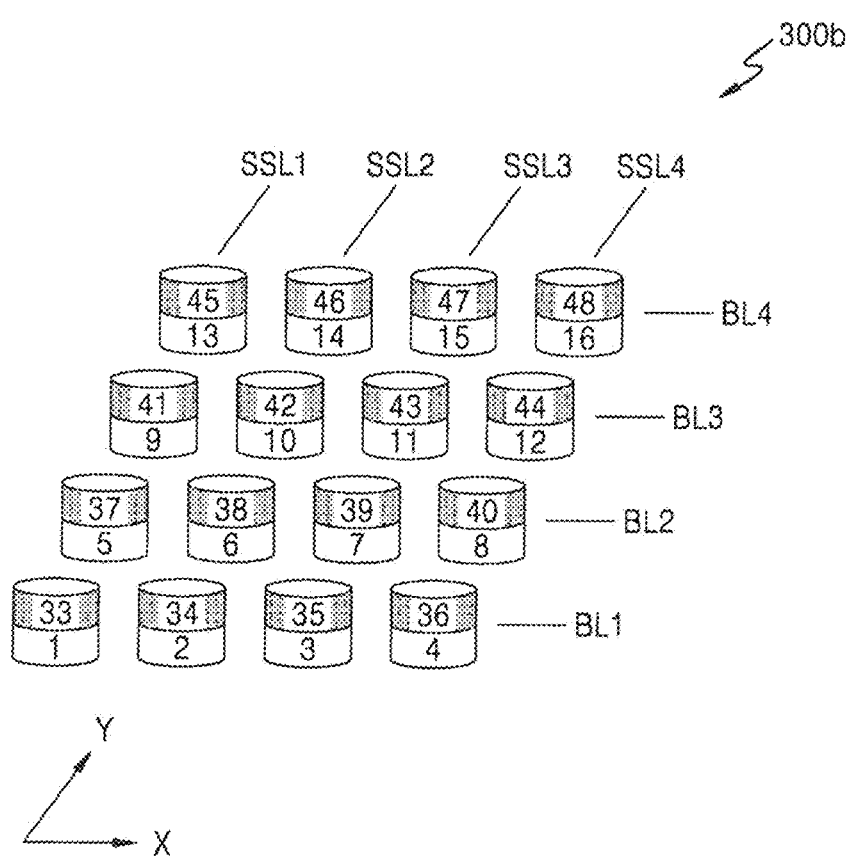

FIGS. 22A and 22B illustrate sequential program orders of a 3D memory device 300b including MLCs, according to some embodiments of the inventive concept. FIG. 22A illustrates an XZ plane of the 3D memory device 300b, and FIG. 22B illustrates an XY plane of the 3D memory device 300b. In FIGS. 22A and 22B, numbers provided in respective cylindrical memory cells indicate ordinal numbers that tell the sequential program orders.

Referring to FIG. 22A, the 3D memory device 300b may include strings NS, which are connected in common to a first bit line BL1 and connected to first to fourth string selection lines SSL1 to SSL4, respectively. Each string NS may include a plurality of memory cells that are connected to n-th to n+2-th word lines WLn to WLn+2, respectively. Referring to FIG. 22B, the 3D memory device 300b may include a plurality of memory cells connected to the n-th word line WLn. According to the present embodiment, MLCs included in the 3D memory device 300b may be programmed by using a shadow program method.

To begin with, LSB program operations may be sequentially performed on memory cells included in an n-th memory group MGn connected to the n-th word line WLn. In this case, a sequential order in which LSB program operations are performed on the memory cells included in the n-th memory group MGn may be as shown in FIG. 22B. Thereafter, LSB program operations may be sequentially performed on memory cells connected to the n+1-th word line WLn+1, then MSB program operations may be sequentially performed on memory cells connected to the n-th word line WLn, then LSB program operations may be sequentially performed on memory cells connected to the n+2-th word line WLn+2, then MSB program operations may be sequentially performed on memory cells connected to the n+1-th word line WLn+1, and then MSB program operations may be sequentially performed on memory cells connected to the n+2-th word line WLn+2.

Figure 23A:
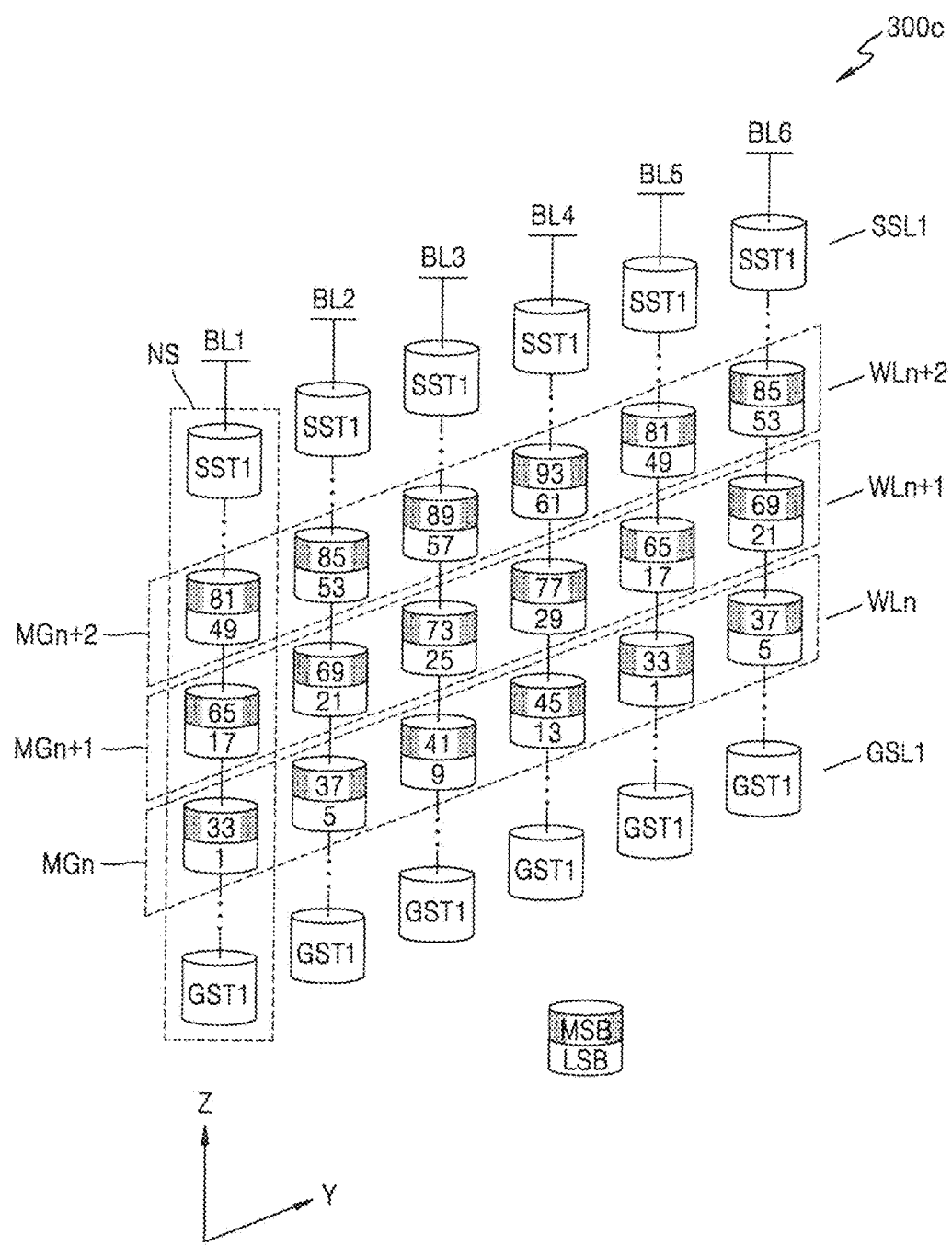
FIGS. 23A and 23B illustrate sequential program orders of a 3D memory device including MLCs according to some embodiments of the inventive concept.
Figure 23B:
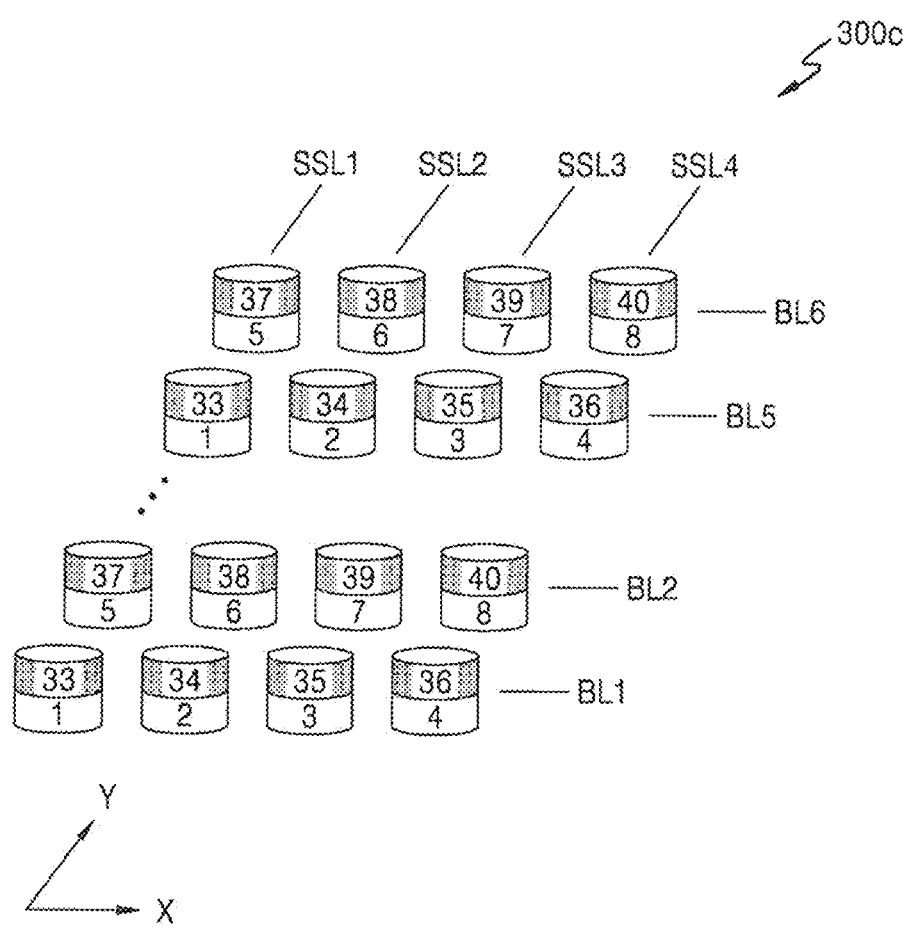

FIGS. 23A and 23B illustrate sequential program orders of a 3D memory device 300c including MLCs, according to some embodiments of the inventive concept. FIG. 23A illustrates an YZ plane of the 3D memory device 300c, and FIG. 23B illustrates an XY plane of the 3D memory device 300c. In FIGS. 23A and 23B, numbers provided in respective cylindrical memory cells indicate ordinal numbers that tell the sequential program orders.

Referring to FIG. 23A, the 3D memory device 300c may include strings NS, which are connected to first to sixth bit lines BL1 to BL6, respectively, and connected in common to a first string selection line SSL1. Each of the strings NS may include a plurality of memory cells connected to n-th to n+2-th word lines WLn to WLn+2, respectively. Referring to FIG. 23B, the 3D memory device 300c may include a plurality of memory cells connected to the n-th word line WLn. In the present embodiment, the first and fifth bit lines BL1 and BL5 may be included in a first bit line group, the second and sixth bit lines BL2 and BL6 may be included in a second bit line group, and the third and fourth bit lines BL3 and BL4 may be included in third and fourth bit line groups, respectively. According to the present embodiment, the MLCs included in the 3D memory device 300c may be programmed by using a shadow program method.

To begin with, LSB program operations may be sequentially performed on memory cells included in an n-th memory group MGn connected to the n-th word line WLn. In this case, a sequential order in which the LSB program operations are performed on the memory cells included in the n-th memory group MGn may be as shown in FIG. 23B. Thereafter, LSB program operations may be sequentially performed on memory cells connected to an n+1-th word line WLn+1, then MSB program operations may be sequentially performed on memory cells connected to the n-th word line WLn, then LSB program operations may be sequentially performed on memory cells connected to an n+2-th word line WLn+2, then MSB program operations may be sequentially performed on memory cells connected to the n+1-th word line WLn+1, and then MSB program operations may be sequentially performed on memory cells connected to the n+2-th word line WLn+2.

Although FIGS. 22A to 23B illustrate examples of the sequential order in which the MLCs are programmed, the inventive concept is not limited thereto. In some embodiments, a program method and a shadow program method according to embodiments may be applied to TLCs.

Figure 24:
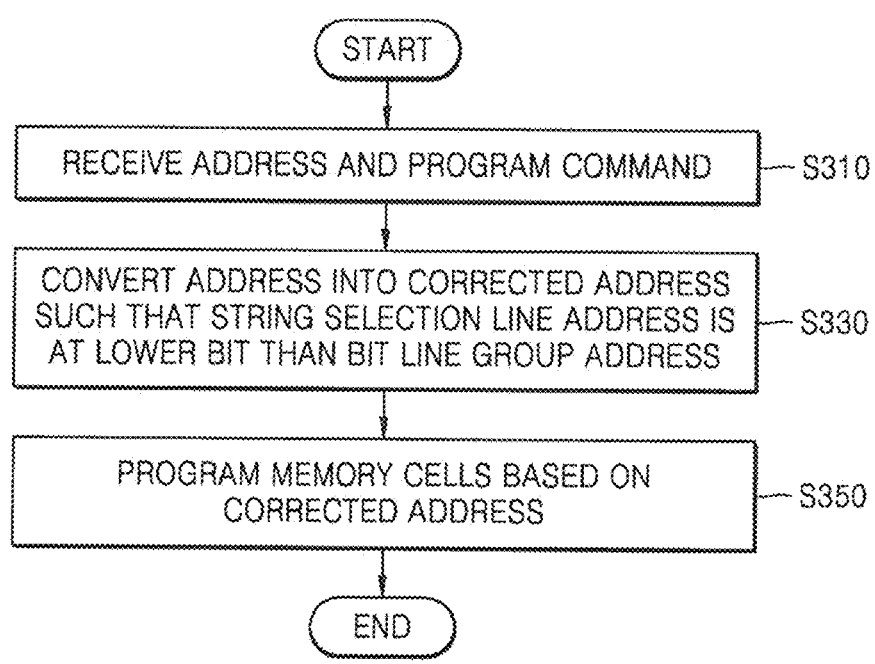
FIG. 24 is a flowchart of a method of programming a non-volatile memory device according to some embodiments of the inventive concept.

FIG. 24 is a flowchart of a method of programming a non-volatile memory device according to some embodiments of the inventive concept.

Referring to FIG. 24, the present embodiment may pertain to a method of programming a non-volatile memory device including a plurality of string selection lines configured to share a word line and a plurality of bit line groups. For example, the method of programming the non-volatile memory device according to the present embodiment may be performed in a temporal sequence by the memory device 100 of FIG. 2. The descriptions presented above with reference to FIGS. 1 to 23B may be applied to the present embodiment, and repeated descriptions will be omitted.

In operation S310, an address and a program command may be received. In operation S330, the address may be converted into a corrected address so that a string selection line address is at a lower bit than a bit line group address. For example, the address may include a logical address, and the corrected address may include a word line address, a bit line group address, and a string selection line address. In operation S350, memory cells may be programmed based on the corrected address. For example, memory cells that are connected to the n-th word line and included in a first bit line group may be sequentially programmed by units of string selection lines. Thereafter, memory cells that are connected to the n-th word line and included in a second bit line group may be sequentially programmed by units of string selection lines.

Figure 25:
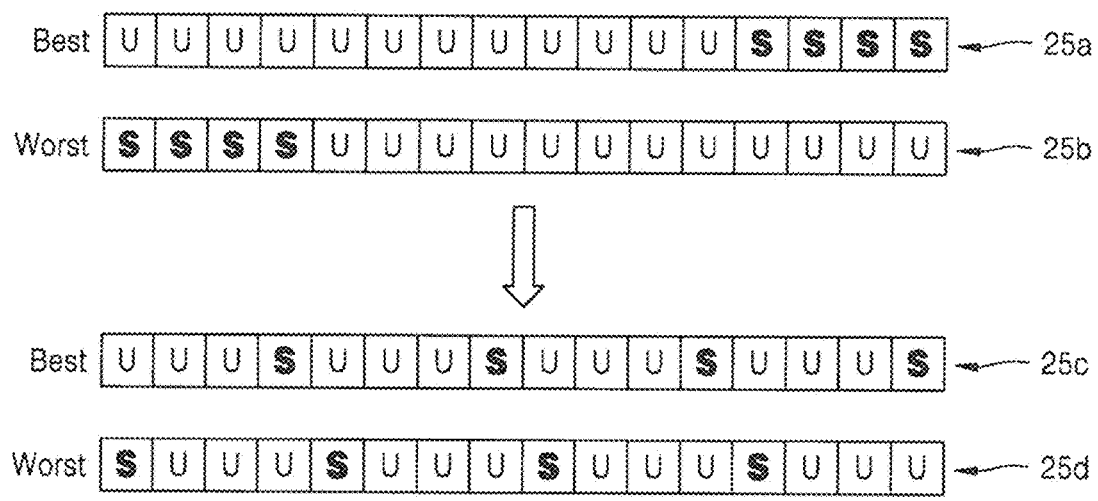
FIG. 25 illustrates sixteen program disturbance cases caused to the memory cells of FIG. 17A.

FIG. 25 illustrates sixteen program disturbance cases caused to the memory cells MC1 to MC16 of FIG. 17A.

Referring to FIG. 25, "U" may indicate a case in which a string selection line is not selected, and "S" may indicate a case in which the string selection line is selected. Accordingly, in case "U", a memory cell may sustain strong FN stress. In case "S", the memory cell may sustain weak FN stress. First and second disturbance cases 25a and 25b may respectively indicate a best case and a worst case when a program method according to some embodiments of the inventive concept is not applied. Meanwhile, third and fourth disturbance cases 25c and 25d may respectively indicate a best case and a worst case when the program method according to the embodiment is applied.

When the program method according to the embodiment is not applied, for example, the memory cells MC1 to MC4 connected to the first string selection line SSL1 may be sequentially programmed, then the memory cells MC5 to MC8 connected to the second string selection line SSL2 may be sequentially programmed, then the memory cells MC9 to MC12 connected to the third string selection line SSL3 may be sequentially programmed, and then the memory cells MC13 to MC16 connected to the fourth string selection line SSL4 may be sequentially programmed.

In the first disturbance case 25a, after strong FN stress is previously applied twelve times, weak FN stress may be applied four times. In this case, since a program disturbance is reduced, the first disturbance case 25a may correspond to the best case. In the second disturbance case 25b, after weak FN stress is previously applied four times, strong FN stress may be applied twelve times. In this case, since a program disturbance increases, the second disturbance case 25b may correspond to the worst case. A rise in threshold voltage of the memory cell in the first disturbance case 25a may greatly differ from a rise in threshold voltage of the memory cell in the second disturbance case 25b.

In the third disturbance case 25c, after strong FN stress is previously applied three times, weak FN stress may be applied once, strong FN stress may be applied three times again, and then weak FN stress may be applied once. In this case, since strong FN stress is applied before weak FN stress, a program disturbance may be reduced. Thus, the third disturbance case 25c may correspond to the best case. In the fourth disturbance case 25d, after weak FN stress is previously applied once, strong FN stress may be applied three times, weak FN stress may be applied once again, and then strong FN stress may be applied three times. In this case, since weak FN stress is applied before strong FN stress, a program disturbance may increase. Thus, the fourth disturbance case 25d may correspond to the worst case.

However, a difference between a rise in threshold voltage of the memory cell in the third disturbance case 25c and a rise in threshold voltage of the memory cell in the fourth disturbance case 25d may be smaller than a difference between the rise in threshold voltage of the memory cell in the first disturbance case 25a and the rise in threshold voltage of the memory cell in the second disturbance case 25b. In other words, the program method according to the present embodiment may improve the worst case so that a difference in program disturbance between the best case and the worst case may be reduced and program disturbances may be generally equalized.

Figure 26:
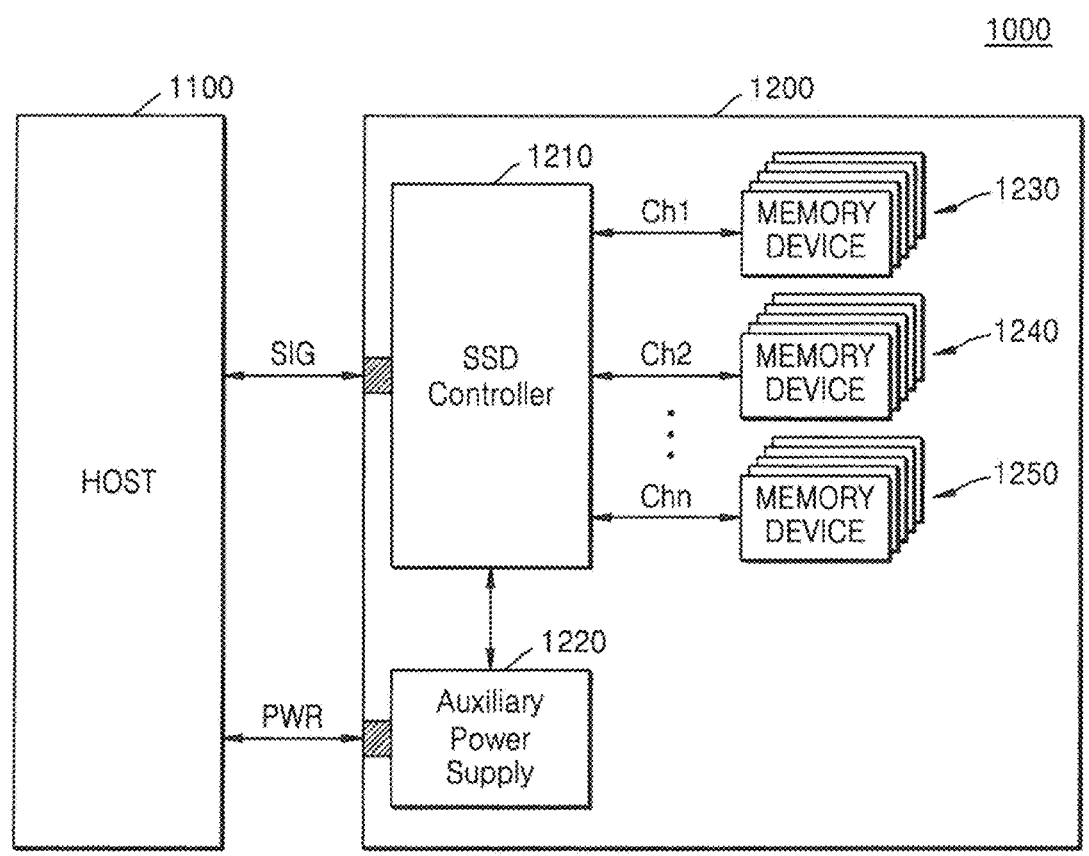
FIG. 26 is a block diagram of an example of a solid-state drive (SSD) system including a memory device to according to some embodiments of the inventive concept.

FIG. 26 is a block diagram of an example of an SSD system 1000 including a memory device according to some embodiments of the inventive concept.

Referring to FIG. 26, the SSD system 1000 may include a host 1100 and an SSD 1200. The SSD 1200 may transmit and receive signals SIG to and from the host 1100 through a signal connector and receive power PWR through a power connector. The SSD 1200 may include an SSD controller 1210, an auxiliary power supply device 1220, and memory devices 1230, 1240, and 1250. The memory devices 1230, 1240, and 1250 may be vertical-stack-type NAND flash memory devices. In this case, the SSD 1200 may be embodied based on the embodiments described above with reference to FIGS. 1 to 25. The memory devices 1230, 1240, and 1250 may transmit and receive data to and from the SSD controller 1210 through channels Ch1, Ch2 . . . Chn.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of programming a non-volatile memory device comprising N string selection lines, a word line, a first bit line group and a second bit line group, the method comprising:
sequentially programming first memory cells that are connected to the word line and at least one bit line included in the first bit line group by sequentially selecting the N string selection lines in response to sequentially applied first to N-th addresses; and then
sequentially programming second memory cells that are connected to the word line and at least one bit line included in the second bit line group by sequentially selecting one of the N string selection lines in response to sequentially applied N+1-th to 2N-th addresses,
wherein N is a natural number greater than or equal to 2.

2. The method of claim 1, wherein the first bit line group comprises a plurality of first bit lines, and
wherein third memory cells that are connected to the word line, an M-th string selection line and any one of the plurality of first bit lines are simultaneously programmed.

3. The method of claim 1, wherein a memory cell of the first memory cells that is connected to an M-th string selection line is programmed before a memory cell of the second memory cells that is connected to the M-th string selection line.

4. The method of claim 1, wherein the N string selection lines comprise a first string selection line and a second string selection line,
wherein sequential programming the first memory cells comprises:
receiving the first address and a first program command;
programming at least one memory cell that is connected to the word line, the at least one bit line included in the first bit line group, and the first string selection line, in response to the first address and the first program command;
receiving a second address and a second program command; and
programming at least one memory cell that that is connected to the word line, the at least one bit line included in the first bit line group, and the second string selection line, in response to the second address and the second program command.

5. The method of claim 4, wherein sequential programming the second memory cells comprises:
receiving a third address and a third program command;
programming at least one memory cell that is connected to the word line, the at least one bit line included in the second bit line group, and the first string selection line, in response to the third address and the third program command;

receiving a fourth address and a fourth program command; and programming at least one memory cell that is connected to the word line, the at least one bit line included in the second bit line group, and the second string selection line, in response to the fourth address and the fourth program command.

6. The method of claim 4, further comprising:

converting the first address into a first corrected address after receiving the first address and the first program command; and converting the second address into a second corrected address after receiving the second address and the second program command, wherein programming the at least one memory cell in response to the first address and the first program command comprises programming the at least one memory cell in response to the first corrected address, and wherein programming the at least one memory cell in response to the second address and the second program command comprises programming the at least one memory cell in response to the second corrected address.

7. The method of claim 6, wherein converting the first address into the first corrected address and converting the second address into the second corrected address comprise placing a string selection line address at a lower bit than a bit line group address.

8. The method of claim 6, wherein the first address comprises a logical address, and wherein the first corrected address comprises a word line address, a bit line group address, and a string selection line address.

9. The method of claim 1, after sequential programming the second memory cells, further comprising:

sequentially programming third memory cells that are connected to an adjacent word line adjacent to the word line and the at least one bit line included in the first bit line group by sequentially selecting the N string selection lines in response to sequentially applied 2N+1-th to 3N-th addresses; and then sequentially programming fourth memory cells connected to the adjacent word line and the at least one bit line included in the second bit line group by sequentially selecting the N string selection lines in response to sequentially applied 3N+1-th to 4N-th addresses.

10. The method of claim 1, wherein the memory cells are multi-level cells (MLCs), wherein sequential programming the first memory cells comprises sequentially performing least significant bit (LSB) program operations on the first memory cells, and wherein sequential programming the second memory cells comprises sequentially performing LSB program operations on the second memory cells.

11. The method of claim 10 further comprising, after sequential programming the second memory cells, sequentially performing following operations:

sequentially performing LSB program operations on third memory cells that are connected to an adjacent word line adjacent to the word line and the at least one bit line included in the first bit line group by sequentially selecting the N string selection lines;

sequentially performing LSB program operations on fourth memory cells that are connected to the adjacent word line and the at least one bit line included in the second bit line group by sequentially selecting the N string selection lines;

sequentially performing most significant bit (MSB) program operations on the first memory cells by sequentially selecting the N string selection lines;

sequentially performing MSB program operations on the second memory cells by sequentially selecting the N string selection lines;

sequentially performing MSB program operations on the third memory cells by sequentially selecting the N string selection lines; and sequentially performing MSB program operations on the fourth memory cells by sequentially selecting the N string selection lines.

12. The method of claim 1, wherein the non-volatile memory device comprises a vertical NAND flash memory comprising a plurality of bit lines, and wherein K bit lines of the plurality of bit lines are connected to one page buffer, and K is equal to a number of bit line groups.

13. The method of claim 1, wherein the non-volatile memory device is a planar NAND flash memory comprising a plurality of bit lines, and wherein K bit lines of the plurality of bit lines are connected to one page buffer, and K is equal to a number of bit line groups.

14. The method of claim 1, wherein the non-volatile memory device comprises a plurality of bit lines and four bit line groups, and wherein four bit lines of the plurality of bit lines are connected to one page buffer.

* * * * *